United States Patent
Crowell et al.

(10) Patent No.: US 9,201,430 B2
(45) Date of Patent: Dec. 1, 2015

(54) TEST HEAD VERTICAL SUPPORT SYSTEM

(71) Applicant: inTEST Corporation, Mount Laurel, NJ (US)

(72) Inventors: Steven Crowell, Merchantville, NJ (US); Charles Nappen, Woodbury, NJ (US)

(73) Assignee: inTEST Corporation, Mount Laurel, NJ (US)

( * ) Notice: Subject to any disclaimer, the term of this patent is extended or adjusted under 35 U.S.C. 154(b) by 0 days.

(21) Appl. No.: 14/191,655

(22) Filed: Feb. 27, 2014

(65) Prior Publication Data

US 2014/0180494 A1    Jun. 26, 2014

Related U.S. Application Data

(62) Division of application No. 12/521,461, filed as application No. PCT/US2007/026306 on Dec. 26, 2007, now Pat. No. 8,700,218.

(60) Provisional application No. 60/971,104, filed on Sep. 10, 2007, provisional application No. 60/877,915, filed on Dec. 29, 2006.

(51) Int. Cl.
*G05D 16/20* (2006.01)
*B66F 3/28* (2006.01)
*B66F 7/16* (2006.01)
*G01R 31/28* (2006.01)

(52) U.S. Cl.
CPC *G05D 16/20* (2013.01); *B66F 3/28* (2013.01); *B66F 7/16* (2013.01); *G01R 31/2887* (2013.01)

(58) Field of Classification Search
CPC ....... G05D 16/20; G05D 16/00; G05D 16/08; G01R 31/2887; B66F 7/16; B66F 3/24; B66F 3/26; B66F 3/28; B66F 3/38
USPC ............ 700/56, 275, 279, 282; 702/108, 117; 324/750.23, 750.24, 750.25, 754.01, 324/756.01; 414/785
See application file for complete search history.

(56) References Cited

U.S. PATENT DOCUMENTS

| | | | | |
|---|---|---|---|---|
| 4,180,098 A * | 12/1979 | Budzich | ................... | 137/596.13 |
| 5,314,174 A * | 5/1994 | Hagman | ................... | 269/75 |
| 5,641,261 A * | 6/1997 | Talbert et al. | ................ | 414/544 |
| 5,738,344 A * | 4/1998 | Hagman | ................... | 269/75 |
| 6,272,853 B1 * | 8/2001 | Broechmann | ................... | 60/414 |
| 6,557,456 B2 * | 5/2003 | Norton et al. | ................... | 92/85 B |
| 7,337,610 B2 * | 3/2008 | Bitter et al. | ................... | 60/469 |
| 7,610,977 B2 * | 11/2009 | Kluver et al. | ............. | 180/65.51 |
| 2006/0156850 A1 * | 7/2006 | Mueller | ................... | 74/490.01 |

OTHER PUBLICATIONS

US Office Action for U.S. Appl. No. 12/521,461, dated May 16, 2013.

* cited by examiner

*Primary Examiner* — Charles Kasenge
(74) *Attorney, Agent, or Firm* — Caesar Rivise, PC

(57) ABSTRACT

A manipulator for translating a load along an axis of translation is provided. The manipulator comprises an outer column and a telescoping column positioned adjacent the outer column. The telescoping column is attached to the load and configured to translate the load along the axis of translation. At least one guiding member is mounted between the outer column and the telescoping column, wherein the guiding member is configured to guide the telescoping column as the telescoping column translates along the axis of translation.

30 Claims, 18 Drawing Sheets

TEST HEAD VERTICAL SUPPORT SYSTEM

CROSS REFERENCE TO RELATED APPLICATIONS

This application is a divisional of U.S. application Ser. No. 12/521,461, filed Jun. 26, 2009, which is a 371 of PCT International Application No. PCT/US2007/026306, filed Dec. 26, 2007, which claims priority under 35 U.S.C. §119 to U.S. Provisional Patent Application Ser. No. 60/877,915, filed Dec. 29, 2006, and U.S. Provisional Patent Application Ser. No. 60/971,104, filed Sep. 10, 2007. All above applications are incorporated fully herein by reference.

FIELD OF THE INVENTION

The present invention relates to the field of art of test head positioners for automatic integrated circuit (IC) testing equipment.

BACKGROUND OF THE INVENTION

Automatic test equipment (ATE) for integrated circuits (ICs) has been developed to facilitate electrical testing of IC's at selected stages of the IC manufacturing process. Such ATE often includes a test head which must be manipulated into a docked position with a testing peripheral using a test head positioner (or manipulator). Test head positioners are generally described, for example, in U.S. Pat. Nos. 6,911,816, 6,888,343, 5,608,334, 5,450,766, 5,030,869, 4,893,074 and 4,715,574, and U.S. patent application Ser. No. 10/955,441. Additional publications which are of particular relevance are WIPO publication WO 05015245A2 to Christian Mueller, WO 04031782A1 to Christian Mueller, and U.S. Pat. No. 4,705,447 to Nathan R. Smith. All of the foregoing are incorporated by reference in their entirety for their teachings in the field of test head positioners for automatic test equipment for integrated circuits or other electronic devices.

Briefly, a conventional automatic testing system generally includes a peripheral apparatus for precisely placing and constraining the IC device under test (DUT) in a fixed position test site. Also included is a moveable test head for testing the DUT. The peripheral apparatus may, for example, be a wafer prober for testing devices before they are separated from a silicon wafer or a package handler for positioning and testing packaged devices. In practice, the test head is translated and/or rotated about one or more axes and brought into the vicinity of the DUT test site included in the peripheral apparatus. Prior to docking, the mating connectors of the test head and the DUT test site are precisely aligned to avoid damaging any of the fragile electrical and mechanical components. Once docked, test electronics of the test head transmit signals through various contacts of the DUT and execute particular test procedures within the DUT. In the course of testing, the test head receives output signals from the DUT, which are indicative of its electrical characteristics.

In order to precisely mate the test head with the peripheral apparatus, the test head is optionally capable of movement with all six degrees of spatial freedom. To facilitate such motion, a test head positioner system is commonly employed to precisely position the test head with respect to the peripheral. The test head positioner system may also be referred to in the art as a test head positioner or a test head manipulator.

Referring now to the exemplary test head positioner described in U.S. Pat. No. 6,888,343, the test head 502 is coupled to main arm 511, and main arm 511 is slideably coupled to linear guide rail 510 that extends vertically along the length of column 545, as best shown in FIGS. 5A and 5B. A motor 2416 may be adapted to translate main arm 511 (and test head 502) vertically along linear guide rail 510. A counter weight assembly biases the weight of main arm 511 (and test head 502) in a substantially fixed vertical position upon disengagement of the motor. As best shown in FIGS. 23 and 24, motor 2416 is mounted to frame 2422 of column 545, and is indirectly connected to pulley 2421 by timing belt 2420. Pulley 2421 is mounted to pulley 2406 by fasteners 2407 (shown in FIG. 23, but not numbered), such that pulleys 2421 and 2406 rotate simultaneously. A cable 2410 is positioned about pulley 2421. One end of cable 2410 is coupled to mount 736 of main arm 511 and the opposing end of cable 2410 is coupled to a counter balance 2413. In operation, if clutch 2426 of motor 2416 is engaged, the motor 2416 rotates pulleys 2406 and 2421, thereby translating the end of cable 2410 that is connected to mount 736 along the Y-axis. Thus, the cable 2410 translates the mount 736 of main arm 511, along with test head 502, in a vertical direction. Once clutch 2426 of motor 2416 is disengaged, the counterbalance 2413 suspends mount 736 and test head 502, in a substantially fixed vertical position. Furthermore, with clutch 2426 of motor 2416 disengaged, test head 502 is in a substantially weightless condition and may be readily moved vertically with a relatively small externally (manually) applied force. This is known as compliance and it enables an operator to manually position the test head or a docking apparatus to maneuver the test head into or out of its docked position with a peripheral.

Further, the exemplary test head positioners disclosed in WO 05015245A2, and WO 04031782A1, and U.S. Pat. No. 4,705,447 both support a test head in a substantially-weightless, compliant condition using a pneumatic apparatus rather than counter weights. In WO 05015245A2 and WO 04031782A1 a pneumatic controller is provided which, in addition to providing compliance, automates vertical translation of the test head.

The aforementioned test head positioner systems may be sufficient; nevertheless, there continues to be a need to further improve vertical support systems for test heads, in the interest of weight, efficiency, simplicity and cost.

SUMMARY OF THE INVENTION

According to one aspect of the invention, a manipulator for translating a load along an axis of translation is provided. The manipulator comprises an outer column and a telescoping column positioned adjacent with respect to the outer column. The telescoping column is attached to the load and configured to translate the load along the axis of translation. At least one guiding member is mounted between the outer column and the telescoping column, wherein the guiding member is configured to guide the telescoping column as the telescoping column translates along the axis of translation.

According to another aspect of the invention, a load positioning system for translating a load along an axis of translation is provided. The load positioning system comprises a telescoping column coupled to the load, and a pneumatically operated piston configured to drive the telescoping column along the axis of translation. The pneumatically controlled unit is configured to raise, lower or substantially maintain the position of the telescoping column along the axis of translation.

According to another aspect of the invention, a load positioning system for translating a load along an axis of translation is provided. The load positioning system comprises a telescoping column coupled to the load, and a pneumatically operated piston configured to drive the telescoping column along the axis of translation. The pneumatically controlled unit includes a regulator configured to raise, lower or substantially maintain the position of the telescoping column along the axis of translation based on a pilot pressure received by the regulator.

According to another aspect of the invention, a load positioning system for translating a load along an axis of translation is provided. The load positioning system comprises a telescoping column coupled to the load; a pneumatically operated piston configured to drive the telescoping column along the axis of translation; and a pneumatically operated brake lock configured to substantially lock the position of the piston upon engagement of the lock. The brake lock may be further configured to sense when the load is unbalanced and prevent disengagement of the lock when the load is unbalanced.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features may be arbitrarily expanded or reduced for clarity. Included in the drawing are the following figures.

DETAILED DESCRIPTION OF THE INVENTION

Figure 1A:
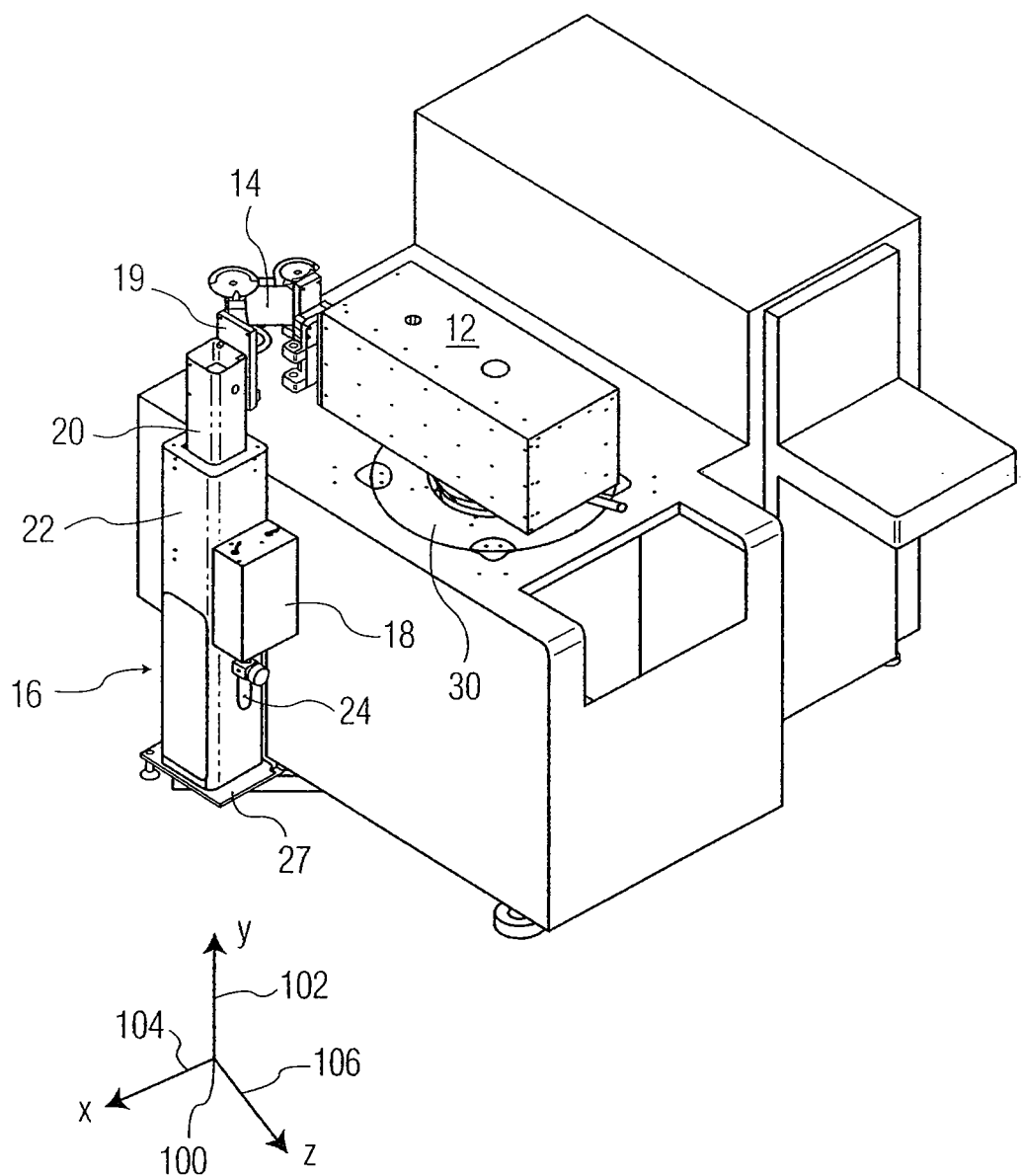
FIG. 1A is a perspective view of a test head manipulator system.

The invention will next be illustrated with reference to the figures. Such figures are intended to be illustrative rather than limiting and are included herewith to facilitate explanation of the present invention. The figures are not necessarily to scale, and are not intended to serve as engineering drawings. In the figures, the numerals following the item numbers (e.g., 16(I)) indicate a position or orientation (e.g., position I) of the feature represented by the item number (e.g., item 16).

To be consistent with descriptions of prior art test head positioner systems, a Cartesian coordinate system 100 illustrated in FIGS. 1A, 1B, 3 and 5 is used in which a vertical axis (otherwise referred to as a Y-axis) is denoted by axis 102, a horizontal axis (otherwise referred to as an X-axis, side-to-side axis or left-right axis) is denoted by axis 104, and another horizontal axis (otherwise referred to as a Z-axis or in-out axis) is denoted by axis 106.

Referring now to FIG. 1A, an automated testing apparatus is denoted by numeral 10. According to this exemplary embodiment, automated testing apparatus 10 comprises a peripheral testing apparatus 30, which may be for example a prober, package handler, device handler, or other apparatus for placing constraining a DUT (not shown) in a substantially fixed position. In the exemplary system shown in FIG. 1A, the exemplary peripheral shown happens to be a prober. A test head 12 is movably positioned above peripheral testing apparatus 30 and configured to selectively engage the DUT for testing purposes at various stages of the IC manufacturing process. An articulating arm assembly 14 interconnects the test head 12 to a test head manipulator 16. Specifically, articulating arm assembly 14 is fastened to plate 19, which is mounted to a surface of test head manipulator 16. Articulating arm assembly 14 includes three segments that are capable of rotation about axes 102 with respect to each other and which are parallel with axis 102. The rotational capability of the articulating arm assembly 14 is particularly relevant to the teachings hereinafter. In particular, articulating arm assembly 14 provides three degrees of motion freedom in a horizontal plane that is parallel to X-axis 104 and Z-axis 106. Low friction bearings and components are used in constructing arm assembly 14 so that compliance is proved in translation in the directions of X-axis 104 and Z-axis 106 as well as in rotation about axes parallel with the Y-axis 102. Articulating arm assembly 14 is derived from the positioner arm assembly described in U.S. Pat. No. 4,705,447. The '447 patent also describes alternative arm structures that provide three degrees of motion freedom in a horizontal plane and which could be adapted to the present invention.

Figure 1B:
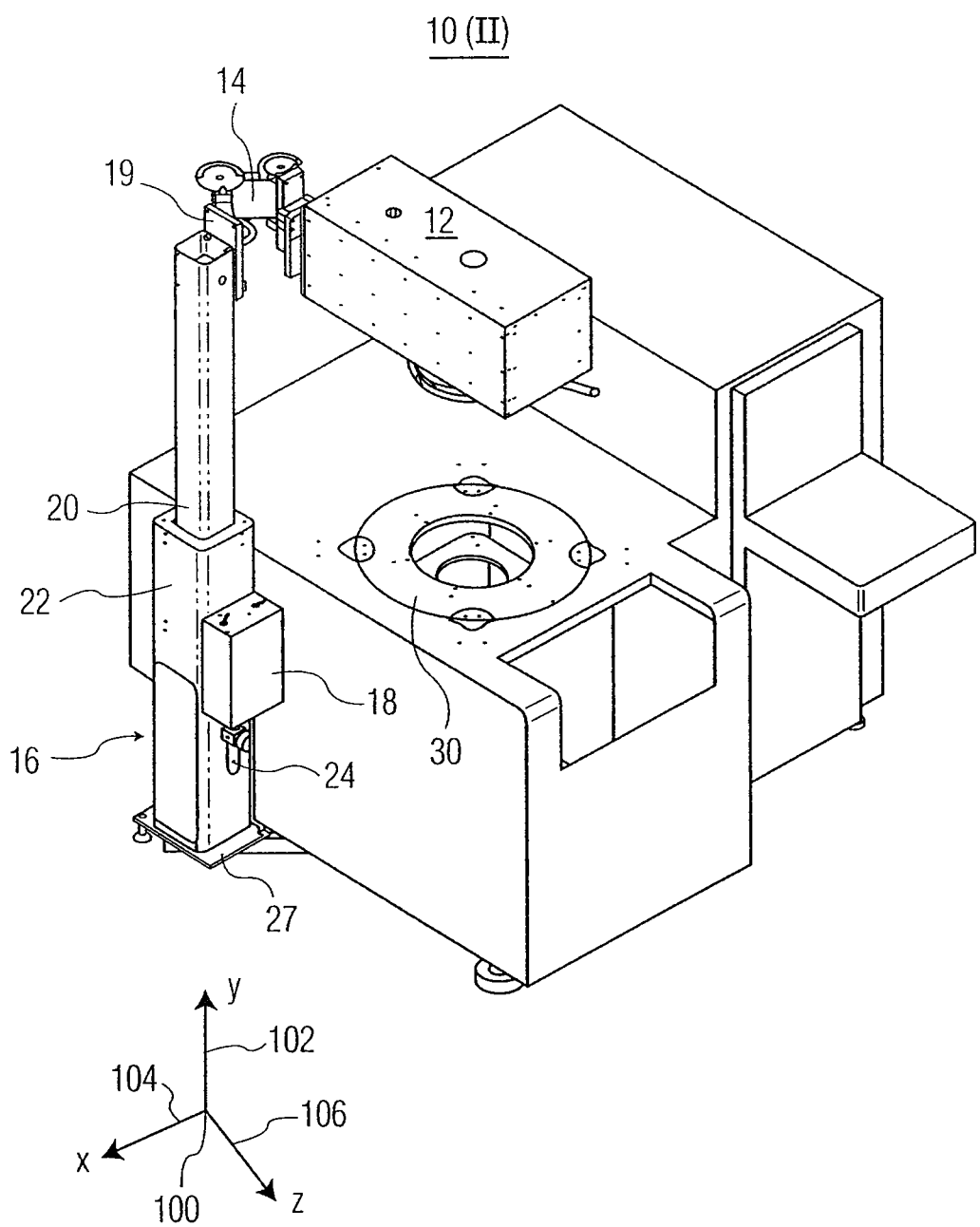
FIG. 1B is another perspective view of the test head manipulator system of FIG. 1A, wherein the test head is illustrated in an elevated position.

Referring now to FIGS. 1A and 1B, the vertical position of test head 12 is controlled by test head manipulator 16. The test head manipulator 16 generally comprises a telescoping column 20 positioned within a rigid outer column 22. The telescoping column 20 is positioned to translate along Y-axis 102 with respect to the fixed outer column 22. The outer column 22 is fixedly mounted to a baseplate 27 and is generally incapable of movement in this exemplary embodiment. However, as described in U.S. Pat. No. 6,888,343, the outer column 22 may be attached to a base assembly which facilitates motion along the X and Z-axes and rotation about the Y-axis. Furthermore, while the illustrated embodiment has the telescoping column member within a fixed outer column member, it is also possible to configure the device such that the inner member is fixed and the outer member telescopes relative thereto.

The telescoping column 20 is shown in a retracted position in FIG. 1A, and an extended position in FIG. 1B. In a retracted position of telescoping column 20, test head 12 is directly adjacent handling apparatus 30 for testing. In an extended position of telescoping column 20, as shown in FIG. 1B, test head 12 is spaced away from handling apparatus 30.

A fluid-based power source is configured to translate telescoping column 20 along the Y-axis 102. In the exemplary embodiment an air-operated pneumatic power source is preferred; however, it is possible that other embodiments may utilize gasses other than air or, in certain situations, incompressible liquids. More particularly, in the exemplary embodiment a pneumatic control unit 18 mounted to the exterior of outer column 22 is configured to supply compressed air to a pneumatic unit 26 (see FIG. 2D) positioned within outer column 22. The pneumatic unit 26 includes a piston that translates in response to the air pressure supplied to pneumatic unit 26 by pneumatic control unit 18. The piston is coupled to telescoping column 20 and configured to translate the telescoping column 20 along vertical axis 102, as described in greater detail with reference to FIG. 2D.

The pneumatic control unit 18 includes a pressure reducing regulator 24 for coupling with a compressed air source (not shown). Although not explicitly shown, pneumatic control unit 18 includes a second adjustable pressure regulator. By adjusting the pressure setting of the second pressure regulator, the telescoping column 20 translates upward, downward, or remains in a fixed, compliant position, as will be described hereinafter. When in the fixed, compliant position, telescoping column 20 may be moved vertically upwards or downwards by a reasonably low external force, providing test head 12 with vertical compliance.

Figure 2A:
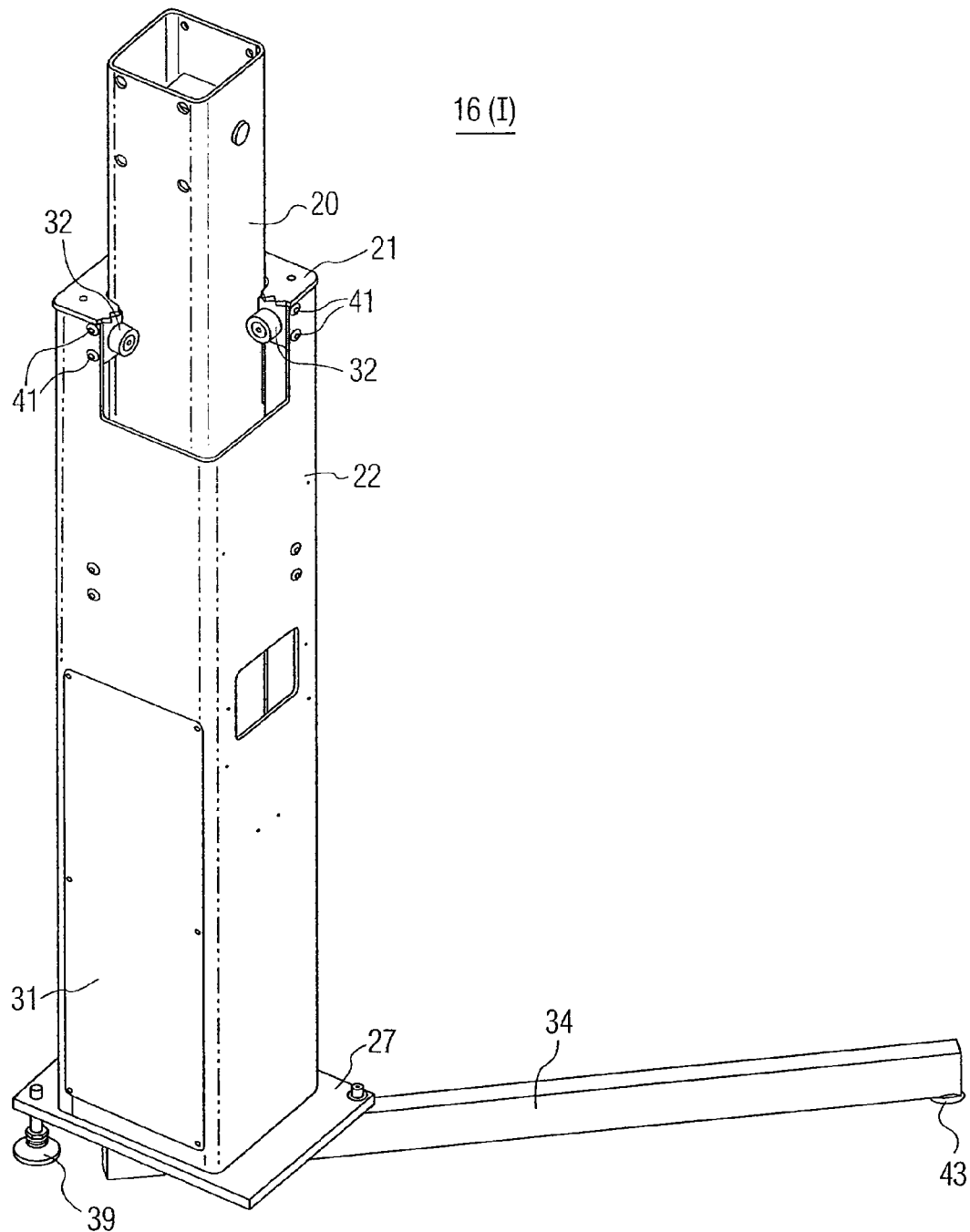
FIG. 2A is a partial cut-away perspective view of the pneumatic manipulator assembly of FIGS. 1A and 1B, whereby the pneumatic control unit is omitted for the purpose of clarity.

Referring now to FIG. 2A, a detailed view of the test head manipulator 16 is shown. The test head manipulator 16 is denoted by the Roman numeral "I" in this figure (and FIG. 2B) to signify that the telescoping column 20 is illustrated in a retracted position. In this figure, pneumatic control unit 18 is omitted for the purpose of clarity.

Figure 4:
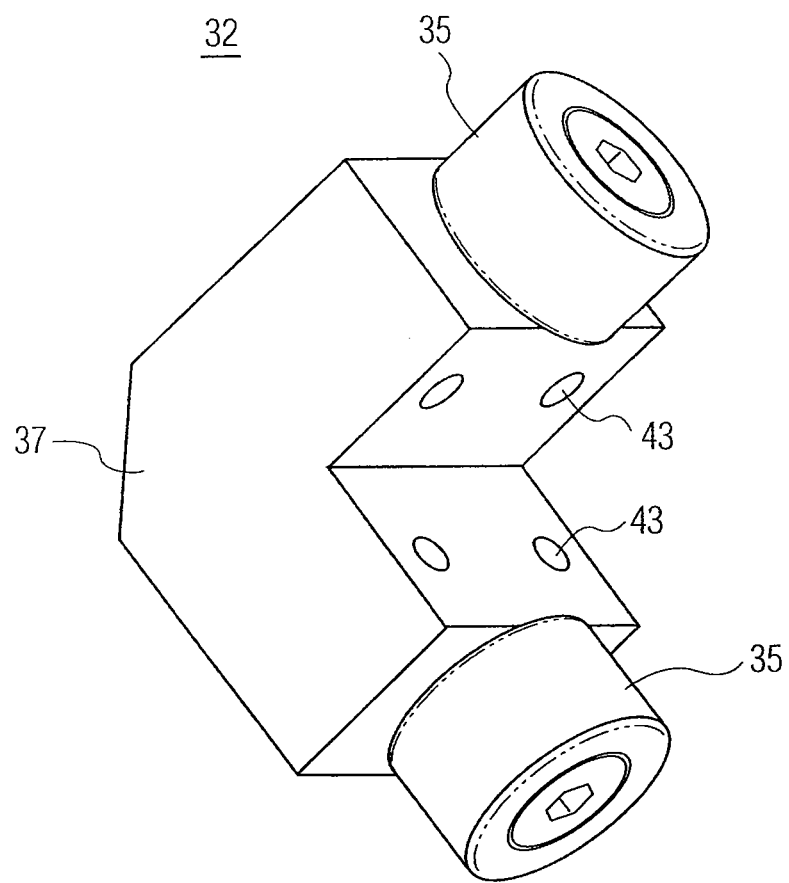
FIG. 4 is a detailed perspective view of the guiding member assembly shown in FIG. 3.

In FIG. 2A, a portion of outer column 22 and manipulator cover 21 are cut away to reveal two guiding member assemblies 32 interposed between telescoping column 20 and outer column 22. The test head manipulator 16 optionally includes a total of four guiding member assemblies (see FIG. 2B). Each guiding member assembly 32 includes two guiding members (for example, cam followers, rollers, or wheels) that freely rotate about their respective axes to facilitate vertical translation of telescoping column 20 with respect to outer column 22, as best shown in FIG. 4. The guiding member assemblies 32 are each fixedly mounted to an interior corner of outer column 22 by a set of four fasteners 41.

A stabilization leg 34 is fixedly mounted to baseplate 27 of the manipulator 16 by one or more fasteners (one fastener shown). A portion of the weight of test head 12 is distributed over the length of stabilization leg 34. The stabilization leg 34 limits deflection of test head manipulator 16 under the weight of the test head 12. A support 43 is positioned on the underside of stabilization leg 34 to contact the floor of the testing facility. Although not shown, the stabilization leg may also be mounted to the floor or mounted to a surface of peripheral testing apparatus 30 to enhance structural integrity of the manipulator 16. Although only one stabilization leg is illustrated, the manipulator may include any number of stabilization legs required to support the weight of the test head and retain the manipulator in a substantially upright position. A support leg 39 is fastened to the underside of baseplate 27 for contacting the floor.

A removable access cover 31 is provided on the outer column 22 to facilitate access to the interior of test head manipulator 16, as explained in greater detail with reference to FIG. 2B. A cover 21 is fastened over the top open end of outer column 22. The cover 21 limits deformation of the top open end of outer column 22 under the weight of test head 12. As explained in greater detail with reference to free body diagram shown in FIG. 5, the weight of test head 12 causes a bending moment that is distributed over the length of telescoping column 20. Reaction forces generated by the bending moment are directly applied to the guiding members. Because guiding members are mounted at or nearby the top end of outer column 22, as shown, a considerable proportion of the force generated by the bending moment is applied to the top end of outer column 22. The cover 21 is fastened to the top end of outer column 22 to limit potential deformation of outer column 22. In addition, cover 21 limits dust and debris from settling within the interior of test head manipulator 16 or interfering with the rotation of the guiding members.

Figure 2B:
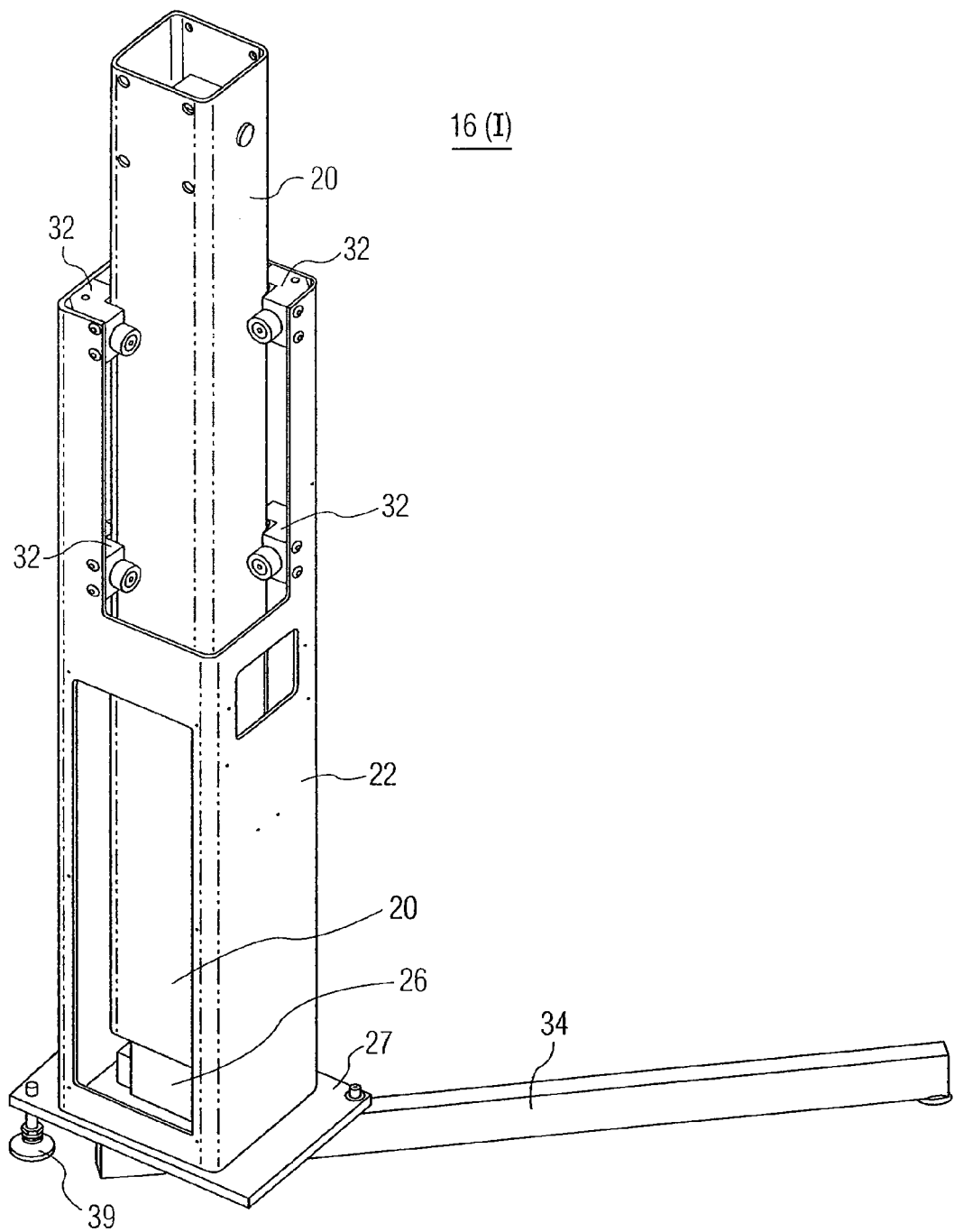
FIG. 2B is another partial cut-away perspective view of the pneumatic manipulator assembly of FIG. 2A.

Referring now to FIG. 2B, the access cover 31 is omitted to reveal the entire length of telescoping column 20 and a small segment of the cylinder block of pneumatic unit 26. The pneumatic unit 26 is optionally positioned within the interior of telescoping column 20 and fixedly mounted to baseplate 27. The pneumatic unit 26 is fluidly connected to the pressurized air source (not shown), via the pneumatic control unit 18, by one or more fluid carrying conduits (not shown). Although not shown in this view, a telescoping piston rod travels within the cylinder block of pneumatic unit 26. The piston rod is indirectly coupled to telescoping column 20 enabling translation of telescoping column 20 along the Y-axis 102, as explained in greater detail with reference to FIG. 2D.

In this view, a portion of outer column 22 is cut-away to reveal four guiding member assemblies 32 mounted to two opposing interior corners of outer column 22. A set of two opposing guiding member assemblies 32 are positioned at the top end of outer column 22, and a second set of opposing guiding member assemblies 32 are positioned at about the midpoint of the length of outer column 22. The two guiding member assemblies 32 mounted at the top end of outer column 22, as shown, are positioned to substantially limit or prevent deflection of telescoping column 20 under the weight of test head 12. Two guiding members 32, positioned at a convenient distance apart to fit the design calculations along outer column 22, provide additional support to telescoping column 20. Although four guiding member assemblies 32 are included in this exemplary embodiment, the test head manipulator may include any number of guiding member assemblies 32. Although four guiding member assemblies 32 are shown, it may be desirable in certain situations to include more than four guiding member assemblies 32. In other situations it may be desirable to include only two guiding member assemblies 32 at locations sufficient to support the load.

Figure 2C:
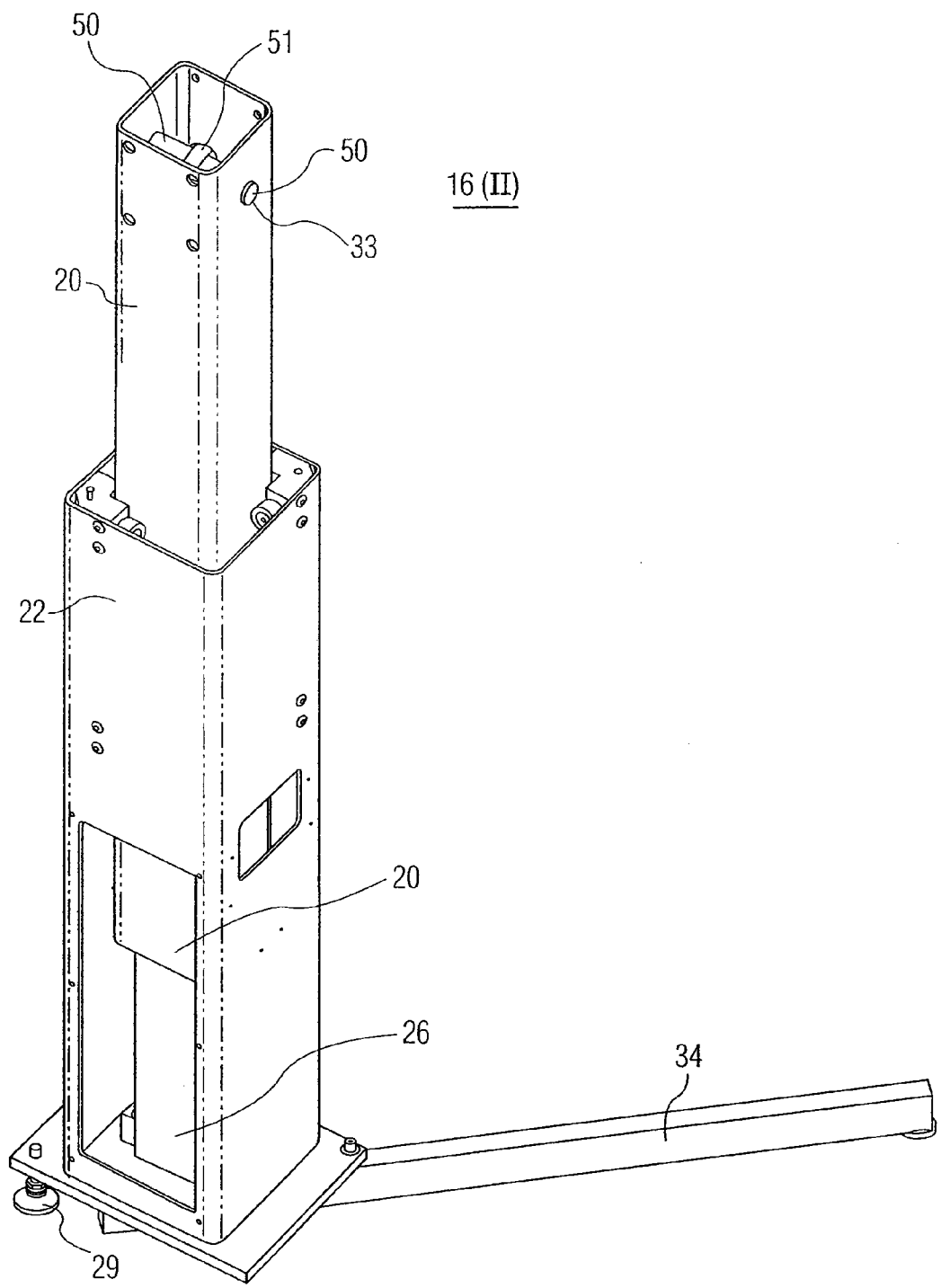
FIG. 2C is a perspective view of the pneumatic manipulator assembly of FIG. 2A, whereby the access panel and column cover are omitted for the purpose of clarity, and the telescoping column and pneumatic piston rod are illustrated in an elevated position.

Referring now to FIG. 2C, another detailed view of the test head manipulator 16 is shown (pneumatic control unit 18 and access cover 31 are omitted for clarity). The test head manipulator 16 is denoted by the Roman numeral "II" in this figure (and FIG. 2D) to signify that the telescoping column 20 is illustrated in an extended position. In this view, telescoping column 20 is elevated to the extended position, thereby revealing a greater length of the cylinder block of pneumatic unit 26, as compared with FIG. 2B.

A spherical bearing 51 couples horizontal shaft 50 to the dynamic piston rod (not shown in this view) of pneumatic unit 26. The horizontal shaft 50 is mounted through apertures 33 disposed in the upper end of telescoping column 20. The pneumatic unit 26 and telescoping column 20 are interconnected at the interface between the horizontal shaft 50 and apertures 33. Although not shown, horizontal shaft 50 may be mounted to aperture 33 by any means known in the art, such as a pin, fastener, bolt, and so forth.

Figure 2D:
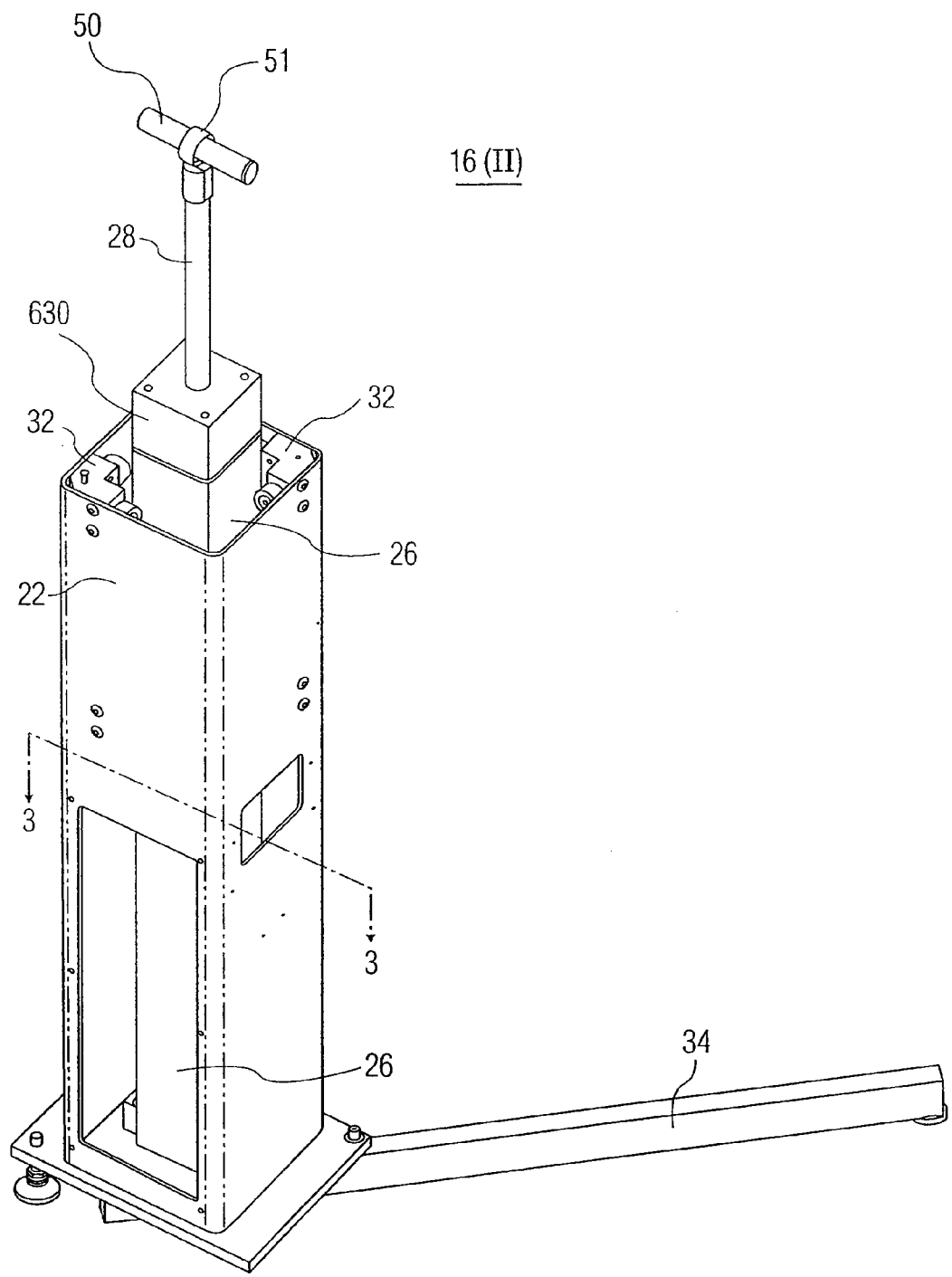
FIG. 2D is a perspective view of the pneumatic manipulator assembly of FIG. 2C, whereby the telescoping column is omitted for the purpose of clarity.

Referring now to FIG. 2D, telescoping column 20 and access cover 31 are omitted to reveal pneumatic unit 26. The pneumatic unit 26 includes a cylinder block, as described previously, a telescoping piston rod 28 that travels within the cylinder block, and a horizontal shaft 50 coupled to the top end of telescoping piston rod 28 with spherical bearing 51. The horizontal shaft 50 is carried in apertures 33 of telescoping column 20, such that axial motion of telescoping piston rod 28 is directly transferred to telescoping column 20 and test head 12. In the illustrated embodiment, the pneumatic unit 26 includes a brake lock 630 configured to lock the position of the telescoping piston rod 28 relative to the cylinder block of the pneumatic unit 26.

Figure 3:
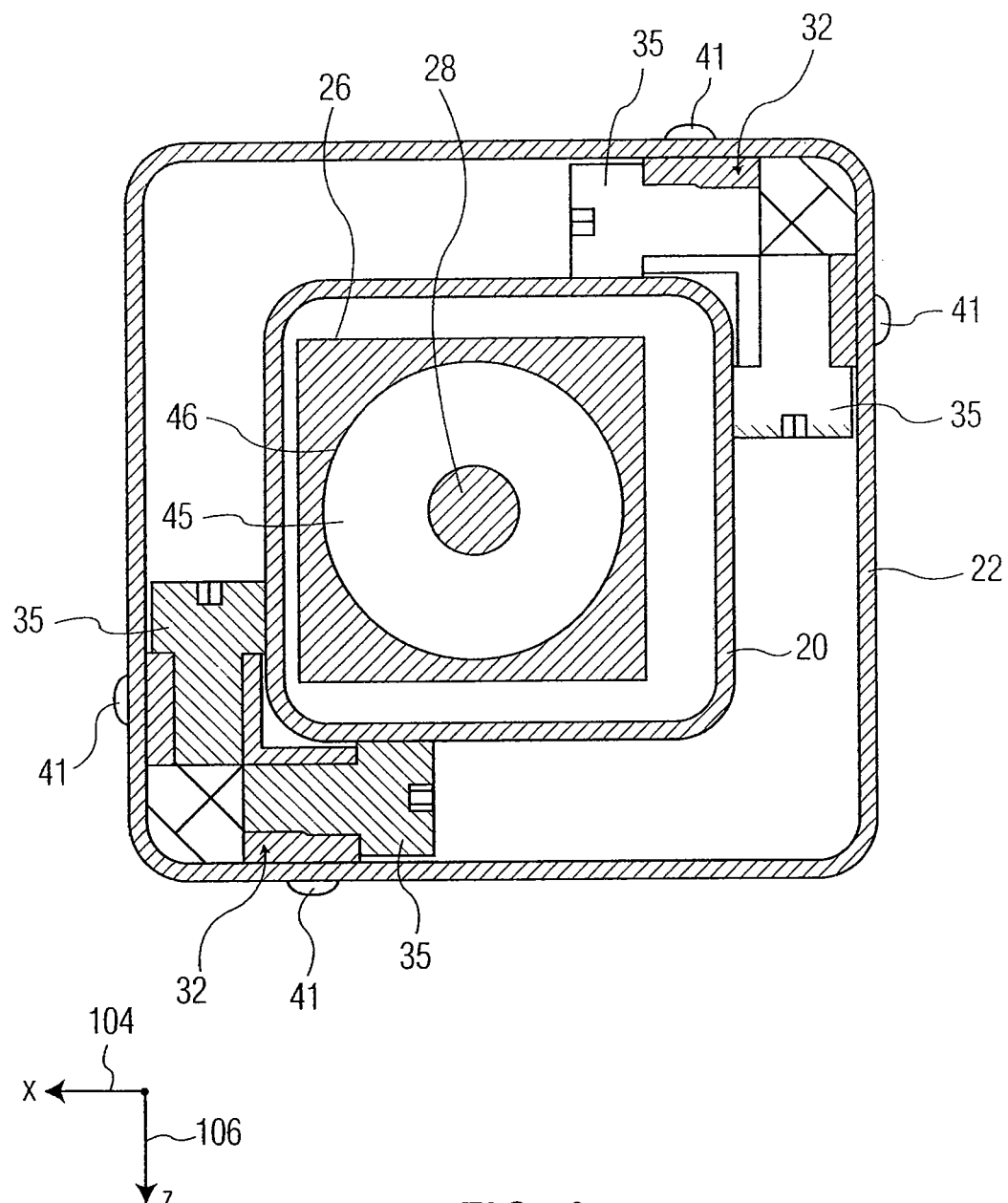
FIG. 3 is a cross-sectional view of the pneumatic manipulator assembly taken along the lines 3-3 shown in FIG. 2D.

Referring now to FIG. 3, a cross-section of test head manipulator 16 of FIG. 2D taken along the lines 3-3 is illustrated. As best shown in FIG. 3, outer column 22 surrounds telescoping column 20, and telescoping column 20 surrounds pneumatic unit 26. The piston rod 28 of pneumatic unit 26 extends from a cylindrical piston 45. The cylindrical piston 45 is slideably carried within a cylinder 46 defined in the cylinder block of the pneumatic unit 26. The vertical motion of piston 45 within cylinder 46 along axis 102 is dependent upon the axial forces acting on the upper and lower surfaces of the piston 45. Air pressure beneath piston 45 provides a force on piston 45 that acts in a direction to move piston 45 upwards. Air pressure and the weight of the load acting on piston rod 28 provides a force on piston 45 that acts in a direction to move piston 45 down. It is noted that the weight of the load includes the combined weights of piston rod 28, telescoping column 20, test head 12, arm assembly 14, and all other apparatus attached to piston rod 28.

More specifically, the piston 45 rises within cylinder 46 if the upwards force due to the fluid pressure beneath piston 45 is greater than the downwards force applied to the top of piston 45 due to fluid pressure above piston 45 combined with the weight of the load. It follows that piston 45 descends within cylinder 46 along Y-axis 102 if the upwards force due to the fluid pressure beneath piston 45 is less than the force applied to the top of piston 45 due to fluid pressure above piston 45 combined with the weight of the load. The piston 45 remains in a substantially fixed position if the upwards and downwards forces on piston 45 are substantially equal. In the exemplary embodiment the region in the cylinder above piston 45 is vented to the outside atmosphere; thus, the fluid above piston 45 is air maintained at atmospheric pressure. It should be understood that the fluid pressure beneath the piston 45 is controlled and dependent upon the pressure setting of pneumatic control unit 18. Thus, by varying the fluid pressure supplied by control unit 18, piston 45 can be controlled to move upwards, move downwards, or remain stationary. Further, it is feasible that additional controls may be added to the system to provide controlled fluid pressure above piston 45, which, in certain situations may provide control advantages. However, for simplicity and minimum cost with reasonable performance, the described exemplary embodiment configuration, using air as the controlled fluid, is preferred.

The operation of pneumatic unit 26 and pneumatic control unit 18 is described in greater detail with reference to FIG. 6.

Referring still to FIG. 3, guiding member assemblies 32 are positioned on opposing exterior corners of telescoping column 20. Two guiding members 35 are rotatably mounted to each guiding member assembly 32. Each guiding member 35 contacts telescoping column 20 at a single point, such that each exterior side of telescoping column 20 is positioned against a guiding member 35. The rotatable guiding members 35 frictionally engage the exterior surfaces of the telescoping conduit 20 to facilitate smooth and uniform translation of conduit 20 along axis 102. Furthermore, constraining all four sides of telescoping column 20 (i.e., by contact with a guiding member 35) substantially limits rotation of telescoping column 20 about Y-axis 102, and substantially limits both rotation and translation of telescoping column 20 about and along the axes 104 and 106.

The guiding member assemblies 32 are mounted to opposite corners of outer column 22. In another exemplary embodiment not illustrated herein, guiding member assemblies 32 are mounted to all four corners of outer column 22. However, it has been discovered that only two guiding member assemblies 32 are required to facilitate translation of telescoping column 20 along Y-axis 102, while limiting rotation of column 20 about axis 102. In addition, a cost savings may be recognized by employing only two guiding member assemblies 32 as opposed to four.

It should be understood that telescoping column is not limited to any particular cross-sectional shape, as the cross-sectional shape of the telescoping column may be triangular, rectangular, square, hexagonal, or any other polygonal shape, for example, to achieve the same result. Alternatively, the cross-sectional shape of telescoping column may be circular and incorporate a slot, bend, recess, track, protrusion or any feature known in the art that is configured to limit rotation of the telescoping column about its longitudinal axis. The columns 20 and 22 may be formed from any rigid material, such as steel, to support the weight of test head 12 and articulating arm assembly 14.

If the cross-sectional shape of telescoping column 20 varies from the illustration, guiding members 35 may be arranged in any desired position to complement that cross-sectional shape to facilitate translation of the telescoping column along Y-axis 102, while limiting rotation of telescoping column 20 about its longitudinal axis which is parallel to Y-axis 102, and limiting rotation and translation of telescoping column 20 about or along the axes 104 and 106.

Although telescoping column 20 is positioned within outer column 22 in the illustrations, the outer column 22 may be positioned within telescoping column 20 to achieve the same benefits. It follows that guiding member assemblies 32 may be mounted to outer column 22, as shown, or, alternatively, guiding member assemblies 32 may be mounted to telescoping column 20.

Referring now to FIG. 4, a detailed perspective view of guiding member assembly 32 is illustrated. The guiding member assembly 32 comprises a solid block 37, and two guiding members 35 rotatably mounted to block 37. The block 37 includes four threaded holes 43 for receiving fasteners 41. In assembly, fasteners 41 are positioned through the wall of outer conduit 22 and threadedly fastened to threaded holes 43 for mounting guiding member assembly 32 to outer conduit 22.

In this exemplary embodiment, guiding member assembly 32 includes two guiding members 35. The guiding members 35 are adapted to rotate freely about their respective axis of rotation. The guiding members 35 are preferably cam followers but may also be casters, rings, washers, wheels, rollers, bearings or any other means known in the art facilitating sliding motion.

The guiding members 35 are positioned substantially orthogonal to one another, such that the exterior corner of telescoping conduit 20 may be positioned between the guiding members. In assembly, the revolving surface of each guiding member 35 is positioned to contact an exterior surface of telescoping conduit 20, as best shown in FIG. 3, to smoothly guide telescoping conduit 20. It should be understood that if the telescoping conduit 20 comprises another shape, such as a triangle, the guiding members may be positioned at other angles with respect to each other.

As described in the Background section, the test head positioner described in U.S. Pat. No. 6,888,343 includes a main arm 511 that is slideably coupled to a linear guide rail 510 that extends vertically along the length of column 545. A complicated and expensive motorized pulley assembly translates main arm 511 along a Y-axis to translate the test head 502 in the vertical direction. The weight of test head 502 is supported by a heavy counter balance 2413.

The pneumatic test head manipulator described herein represents a significant departure from the motorized test head positioner described in U.S. Pat. No. 6,888,343 (hereinafter '343). The pneumatic test head manipulator described herein comprises significantly less components and weighs considerably less than the motorized pulley assembly of '343. Moreover, utilizing a plurality of guiding members provides adequate performance and is a marked cost improvement over the expensive linear guide rail 510 and associated bearings of '343, which are commonly used in the contemporary art of test head positioners. In contrast, guiding members 35 facilitate smooth and efficient translation of telescoping column 20 at a considerably lower cost.

Figure 5:
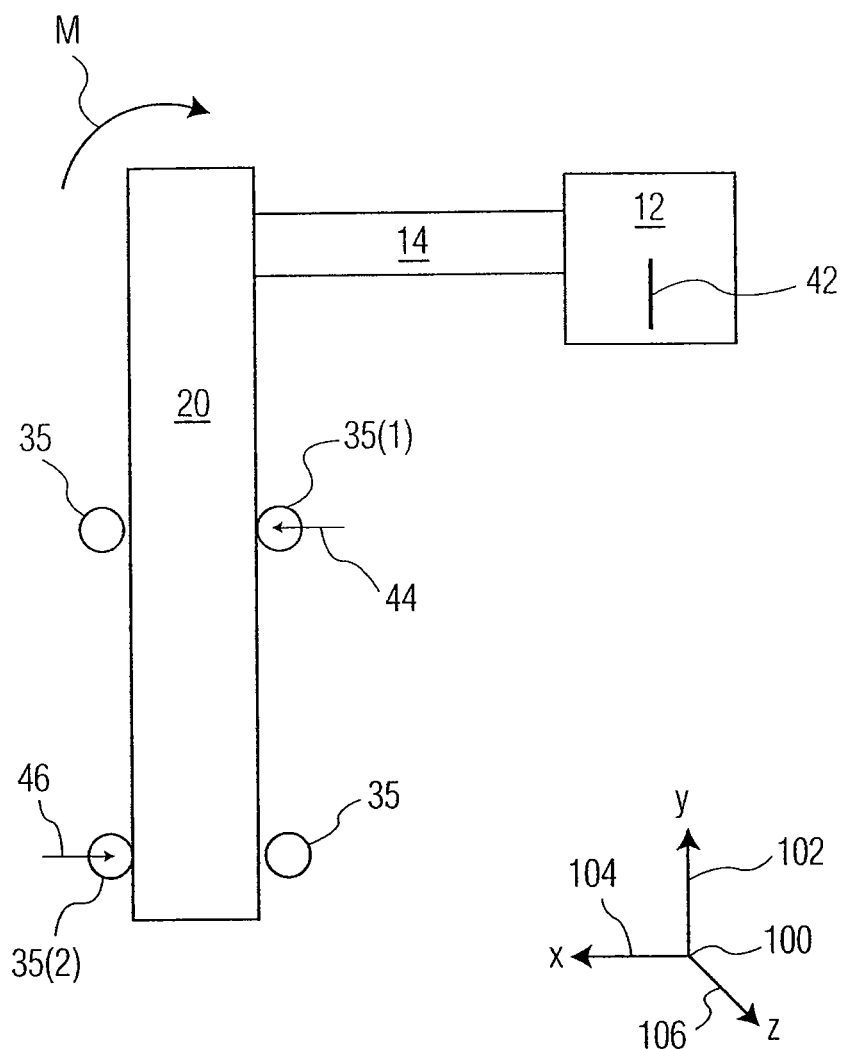
FIG. 5 is a free body diagram illustrating the forces acting upon the test head and pneumatic manipulator assembly, shown schematically.

Referring now to FIG. 5, a free body diagram illustrating the forces applied to test head manipulator 16 is shown. The test head 12 and telescoping column 20 are separated by a horizontal distance (along horizontal axis 104) by articulating arm assembly 14. By separating test head 12 and telescoping column 20, the weight of test head 12, which is represented by the downward arrow 42, yields a bending moment "M" about telescoping column 20. This may also be commonly referred to in the art as a cantilevered load. The bending moment "M" is distributed through the length of telescoping column 20. The bending moment "M" produces offsetting reaction forces 44 and 46, which are applied at the points of contact between guiding members 35(1) and 35(2) and telescoping column 20, as shown. It follows that the guiding members 35, the fasteners that couple guiding members 35 to guiding member assembly 32, and the fasteners that couple guiding member assembly 32 to outer column 22, are each uniquely designed to withstand the resultant stress of the bending moment "M."

Figure 6:
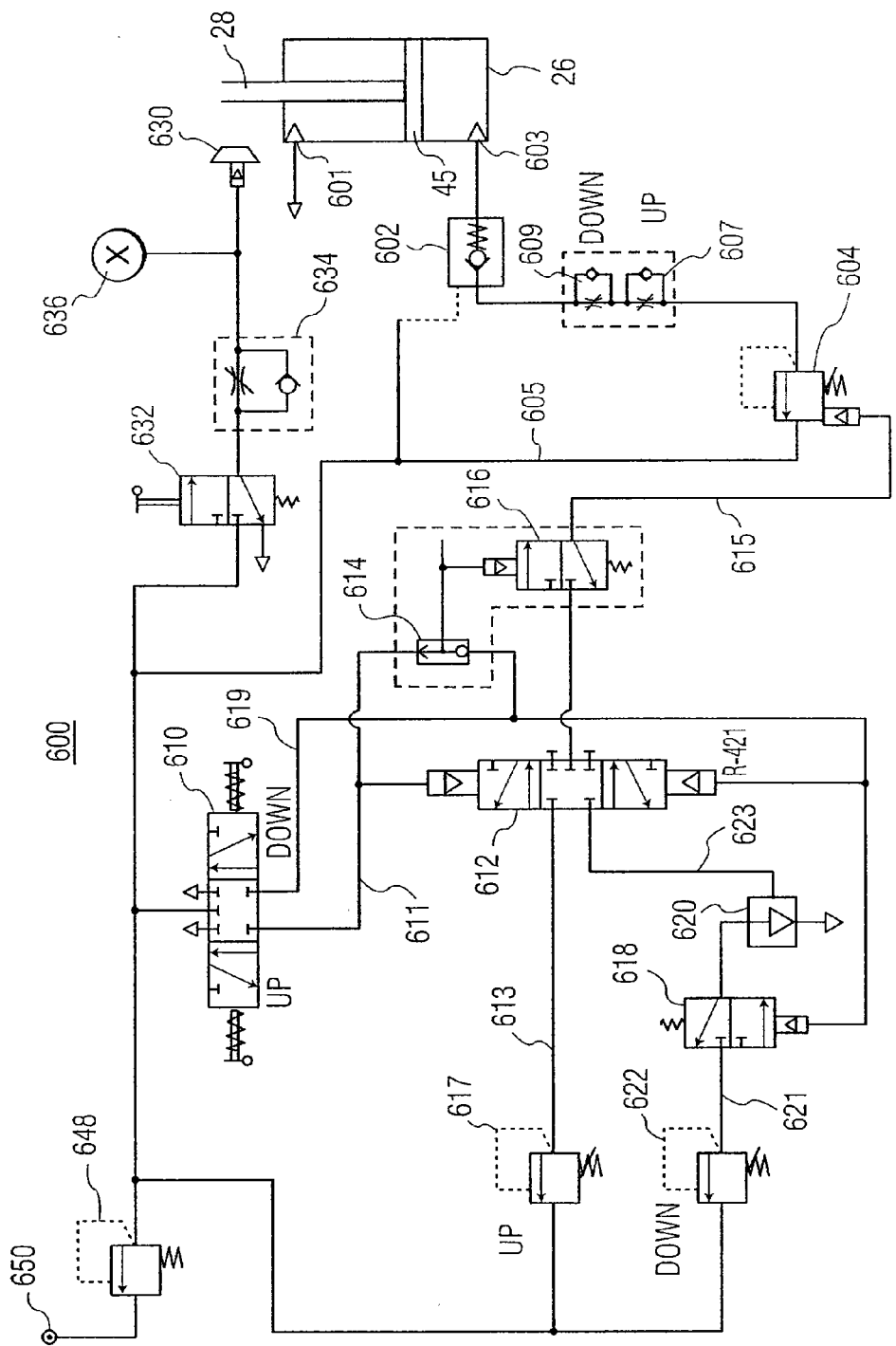
FIG. 6 is a schematic diagram of a portion of an exemplary pneumatic system for controlling movement of the automated testing apparatus.

Referring to FIG. 6, an illustrative pneumatic system 600 which is part of the pneumatic control unit 18 and which is configured to control the linear motion of the telescoping column 20 will be described. The pneumatic system 600 is configured to control the pressure and flow of fluid to pneumatic unit 26 to control the up and down motion of the piston rod 28 as well as its static and compliant behavior. While the system 600 is described herein as a pneumatic system utilizing air as the operating fluid, the invention system is not limited to such and other fluids, for example, oil, may be utilized.

In the present embodiment, the pneumatic unit 26 is a double acting cylinder which is vented to atmosphere at port 601 on one side of the piston 45 and connected to a pneumatic feed line 603 on the opposite side of the piston 45. A spring biased check valve 602 is provided in feed line 603 and is configured to close upon loss of pilot pressure in the system to prevent falling of the piston rod 28. A piloted, biased pressure regulator 604 is positioned along the feed line 603 and is configured to control the pressure (and consequently the rate of flow) of the fluid delivered to the pneumatic unit 26. The pressure regulator 604 receives pressurized fluid from a pressure source 650 along pressure feed line 605. A pressure regulator 648 is provided along the pressure feed line 605 to regulate the fluid pressure to a desired pressure. Pressure regulator 648 also includes a filter (not shown) to clean the air as it enters the system.

Biased pressure regulator 604 includes a biasing member, for example, a control knob, to allow mechanical adjustment of the pressure and fluid flow through regulator 604 to initialize the system. The biasing member can also be subsequently adjusted to reset the system as necessary. The biasing member is manipulated such that the fluid pressure passing through the biased pressure regulator 604 provides an upwards force on piston 45 that is substantially equal to the downward force applied by the telescoping column 20 and associated load on the piston rod 28. By equalizing such pressure, the pressure on the piston rod 28 is balanced such that the telescoping column 20, and thereby the test head 12, is in a static or substantially weightless state. While in a weightless state, the heavy test head 12 may be manually positioned to dock (i.e., mate or engage) the test electronics of the heavy test head 12 with the IC under test disposed on the peripheral testing apparatus 30. A pair of variable restriction valves 607, 609 may be provided between the pressure regulator 604 and the pneumatic unit 26 to control the rate of fluid during upward or downward movement of the piston rod 28. As described in more detail in WO/05015245A2, due to friction and the breakaway force associated with piston 45, the upwards and downwards pressures acting on piston 45 do not need to be exactly equal to maintain a static position. As is further described in WO/05015245A2, the pressure provided by the system may be slightly adjusted higher or lower for added system functionality and capabilities.

A toggle valve 610 is provided in the pneumatic system 600 to allow an operator to control upward and downward movement of the piston rod 28. While a toggle valve is shown and described, other types of directional control valves may be utilized. The toggle valve 610 is spring biased to a neutral position wherein a zero pilot pressure (relative to atmospheric pressure) is provided to the pilot control of the biased pressure regulator 604. With no pilot pressure to the pilot control, biased pressure regulator 604 remains in the equalized position such that the piston rod 28 remains in the balanced or static state.

To move the telescoping column 20 upward, the operator moves the toggle to the 'up' position wherein the toggle valve 610 opens an 'up' pilot pressure line 611 to the pressure source 650. The pressurized fluid passes through the 'up' pilot pressure line 611 to an up pilot control of a three-position up/down valve 612, which is normally in a closed position, and through a shuttle valve 614 to the pilot control of a pilot access valve 616, which is also normally closed. The pressure on the pilot control of the pilot access valve 616 causes the valve 616 to open, thereby providing a fluid line 615 between the pilot control of pressure regulator 604 and the up/down valve 612. At the same time, the pressure through 'up' pilot pressure line 611 onto the 'up' pilot control of the up/down valve 612 causes an 'up' port of the up/down valve 612 to open, thereby providing a direct line 613 between the pressure source 650 and the pilot control of the pressure regulator. A pressure regulator 617 is preferably provided along the pressure line 613 to provide a desired positive pressure to the pilot control of biased pressure regulator 604. Thus, regulator 617 will control the speed and/or the force of the pneumatic unit in the up direction.

In the present embodiment, the positive pressure to the pilot control of biased pressure regulator 604 causes the set pressure of regulator 604 to increase, thereby increasing the pressure within pneumatic unit 26, causing the piston rod 28 and the telescoping column 20 to rise. Release of the toggle will return the toggle valve 610 to the neutral position, thereby discontinuing the additional pilot pressure to the pilot control of regulator 604. As such, the output pressure of regulator 604 returns to its original set pressure defined by the mechanical biasing member and the piston rod 28 is again in a balanced or static state.

For clarity purposes, a brief explanation of the basic operation of the biasing pressure regulator 604, such as the ControlAir Inc. Type 650 (Positive Bias Relay) or Type 200 (Precision Air Relay), is provided. The biased pressure regulator 604 yields an output pressure that is substantially equal to the set pressure which is the sum of the inputs, the biasing member and the pilot control member. Thus, the set pressure of the biased pressure regulator 604 can be adjusted by reducing or increasing the force on the mechanical biasing member. In addition, the set pressure of the biased pressure regulator 604 can be adjusted by adding or subtracting pilot pressure to the pilot control member. Both of these inputs, the biasing member and the pilot control member, provide complete control of the output pressure and can be controlled independently. Additional information, of this type of biasing pressure regulator, including possible applications and principle of operation is available.

To translate the telescoping column 20 downward, the operator moves the toggle to the down position wherein the toggle valve 610 opens a down pilot pressure line 619 to the pressure source 650. Similar to the 'up' scenario, pressurized fluid passes through the down pilot pressure line 619 through the shuttle valve 614 to the pilot control of a pilot access valve 616 thereby providing fluid line 615 between the pilot control of control valve 604 and the up/down valve 612. At the same time, pressurized fluid through the down pilot pressure line 619 also energizes the pilot control of vacuum control valve 618 which the normally closed valve 618 to open. Opening of vacuum control valve 618 connects vacuum ejector 620 to the pressure source 650 via pressure line 621. Again, a pressure regulator 622 is preferably provided along pressure line 621. The positive pressure received by the vacuum ejector 620 causes a negative pressure (that is, a pressure below atmospheric pressure) along pressure line 623. The pressurized fluid passing through the down pilot pressure line 619 also energizes a down pilot control of the up/down valve 612 which opens a line between the negative pressure line 623 and the pilot fluid line 615. As such, the pilot control of the biased pressure regulator 604 is subjected to a reduced pilot pressure which causes the output pressure of regulator 604 to be reduced whereby the pressure to the pneumatic unit 26 is also reduced. In other words, a pressure below atmospheric pressure is applied to the pilot control of regulator 604 which reduces its set-point pressure which in turn reduces the pressure delivered to pneumatic unit 26. As such, the weight of the piston rod 28, telescoping column 20 and the testing head 12 will be greater than the pressure in the pneumatic unit 26 and the piston rod 28 will be lowered. Again, release of the toggle will return the toggle valve 610 to the neutral position, thereby discontinuing negative pilot pressure to the pilot control of the control valve 604. As such, the output pressure of regulator 604 returns to its original position and the piston rod 28 is again maintained in a balanced or static state.

The pneumatic system 600 illustrated in FIG. 6 also includes a brake lock 630 configured to lock the position of the telescoping column 20. Brake lock 630 is controlled by fluid pressure. When no fluid pressure is applied to its inlet port, brake lock 630 is in the locked position maintaining telescoping column 20 in a fixed position. In order to move telescoping column 20, fluid pressure is applied to brake lock 630. A two-position toggle valve 632 is positioned between the brake lock 630 and the pneumatic source 650. The toggle valve 632 is normally closed so that no pressure is applied to brake lock 630, locking telescoping column 20 in position. To release the brake lock 630, the toggle is switched to the open position such that the pressurized fluid actuates the release of brake lock 630. The brake lock 630 may be, for example, a fluid actuated, linear rod lock. A throttle valve 634 is preferably positioned between the toggle valve 632 and the brake lock 630 to prevent a sudden actuation of the release of the brake lock 632 when the toggle is moved to the open position. A fluid actuated indicator 636, for example, an indicator light which lights when pressure is applied, may also be provided to indicate when the brake lock 630 is unlocked.

Figure 7:
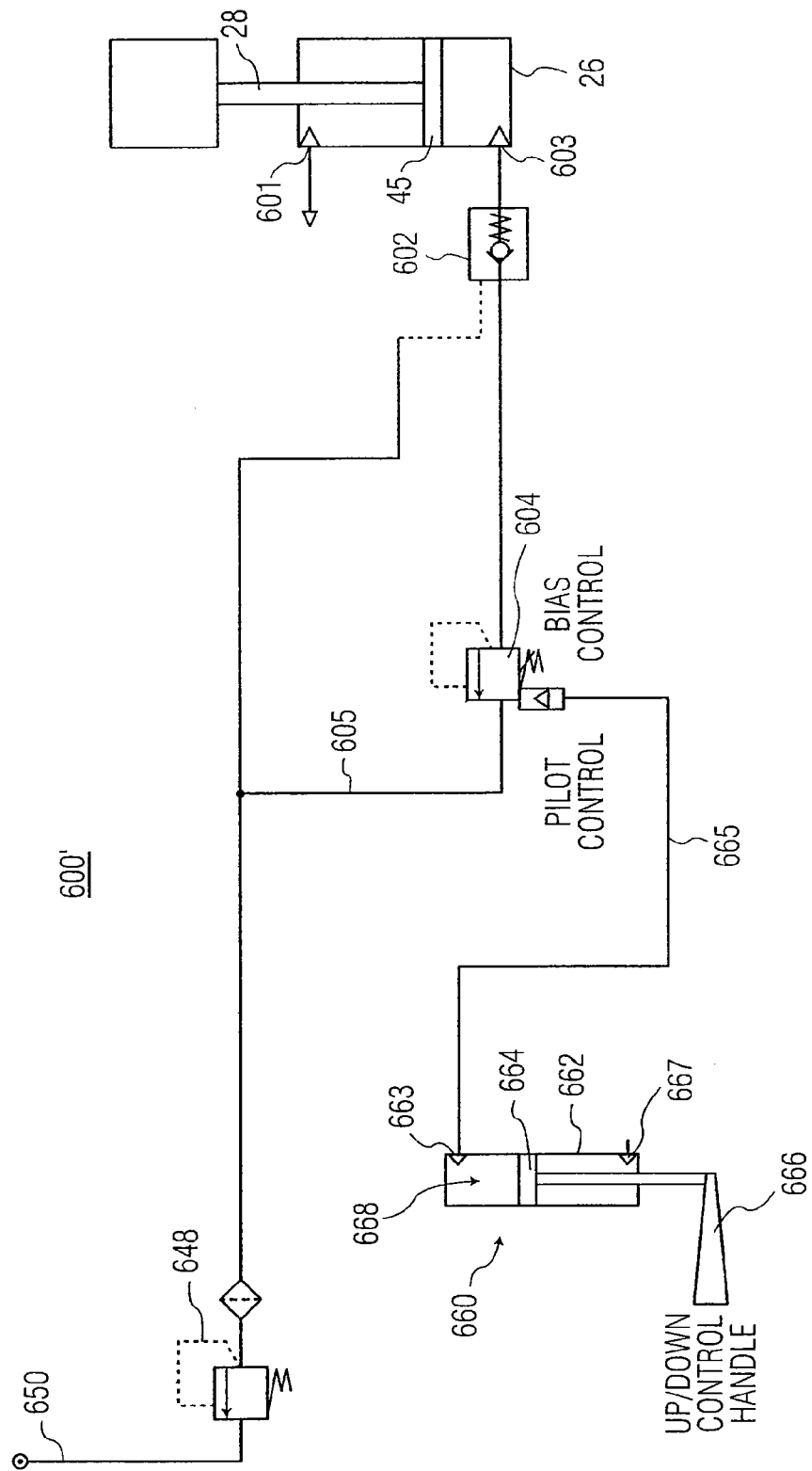
FIG. 7 is a schematic diagram of a portion of another exemplary pneumatic system for controlling movement of the automated testing apparatus.

Referring to FIG. 7, another exemplary pneumatic system 600' which is part of the pneumatic control unit 18 and which is configured to control the linear motion of the telescoping column 20 will be described. The pneumatic system 600' is similar to the previous embodiment and is configured to control the pressure and flow of fluid to pneumatic unit 26 to control the up and down motion of the piston rod 28 as well as its static and compliant behavior.

As in the previous embodiment, the pneumatic unit 26 is a double acting cylinder which is vented to atmosphere at port 601 on one side of the piston 45 and connected to a pneumatic feed line 603 on the opposite side of the piston 45. A spring biased check valve 602 is provided in feed line 603 and is configured to close upon loss of pilot pressure in the system to prevent falling of the piston rod 28. A piloted, biased pressure regulator 604 is positioned along the feed line 603 and is configured to control the pressure (and consequently the rate of flow) of the fluid delivered to the pneumatic unit 26. The pressure regulator 604 receives pressurized fluid from a pressure source 650 along pressure feed line 605. A pressure regulator 648 is provided along the pressure feed line 605 to regulate the fluid pressure to a desired pressure. Pressure regulator 648 also includes a filter (unnumbered) to clean the air as it enters the system.

A throttle assembly 660 is provided in the pneumatic system 600' to allow an operator to control upward and downward movement of the piston rod 28. The throttle assembly 660 includes a cylinder 662 with a piston 664 moveable within the cylinder 662 via a handle or the like. One end of the cylinder 662 includes a port 667 open to atmosphere and the other end includes a port 663 that is connected to a pilot line 665 fluidly connected to the pilot control of the biased pressure regulator 604. A variable volume chamber 668 is defined between the piston 664 and the port 663, however, the mass of fluid, e.g. air, within the chamber 668 and pilot line 665 is fixed.

The throttle assembly 660 is assembled such that when force is not applied to the handle 666, the piston 664 is positioned such that the fluid pressure within the chamber 668 and pilot line 665 is neutral, i.e. a zero pilot pressure (relative to atmospheric pressure) is provided to the pilot control of the biased pressure regulator 604. With no pilot pressure to the pilot control, biased pressure regulator 604 remains in the equalized position such that the piston rod 28 remains in the balanced or static state.

To move the telescoping column 20 upward, the operator moves the handle 666, and thereby the piston 664, toward the port 663, thereby reducing the volume of chamber 668. Since the fluid mass is constant, the decrease in volume of the chamber 668 will cause the fluid pressure in the chamber 668 and pilot line 665 to increase. The increased pressure is applied directly through the pilot line 665 to the pilot control of pressure regulator 604. As explained above, the set pressure of the biased pressure regulator 604 can be adjusted by adding or subtracting pilot pressure to the pilot control member.

In the up scenario, the positive pressure to the pilot control of biased pressure regulator 604 causes the set pressure of regulator 604 to increase, thereby increasing the pressure within pneumatic unit 26, causing the piston rod 28 and the telescoping column 20 to rise. The amount of increase in the set pressure of regulator 604 correlates to the amount of additional positive pressure on the pilot control. Since movement of the handle 666 controls the volume of the chamber 668, the amount of increase in pilot pressure, and the corresponding increase in set pressure of regulator 604, is continuously variable over the range of movement of the piston 664 between the neutral position toward the port 663.

Upon release of the handle 666, the piston 664 moves back to the neutral position to allow the pressure within the chamber 668 and pilot line 665 to return to the neutral pressure.

To translate the telescoping column 20 downward, the operator moves the handle 666 such that the piston 664 moves from the neutral position away from the port 663, thereby increasing the volume of the chamber 668. Since the fluid mass is constant, the increase in volume of the chamber 668 will cause the fluid pressure in the chamber 668 and pilot line 665 to decrease. The decreased pressure is applied directly through the pilot line 665 to the pilot control of pressure regulator 604 which causes the set pressure of regulator 604 to decrease, thereby decreasing the pressure within pneumatic unit 26. As such, the weight of the piston rod 28, telescoping column 20 and the testing head 12 will be greater than the pressure in the pneumatic unit 26 and the piston rod 28 will be lowered. Again, release of the handle 666 will return the piston 664 to the neutral position, thereby discontinuing negative pilot pressure to the pilot control of the control valve 604.

As with the up scenario, since movement of the handle 666 controls the volume of the chamber 668, the amount of decrease in pilot pressure, and the corresponding decrease in set pressure of regulator 604, is continuously variable over the range of movement of the piston 664 between the neutral position away from the port 663. In both the up and down scenarios, the variable pressure range provides a tactile feedback at the handle 666. The operator senses that the more force the operator applies to the handle 666, the more the pressure will change (either increase or decrease) in response thereto. This change in pressure, felt in force by the operator upon the handle 666, represents the force applied to the piston 45 via the biased pressure regulator 604 and throttle assembly 660, thus providing tactile feedback. The operator can also control the acceleration, speed, and position of the test head in this manner. The operator may observe the movement and/or the behavior of the test head as he or she causes the set pressure of biased regulator 604 and thus the force on piston 45 to change via moving the handle 666 up or down. The operator may adjust the handle 666 as necessary to initiate motion of the test head at a desired rate, maintain a desired speed, and stop motion at a desired rate and position.

Figure 8:
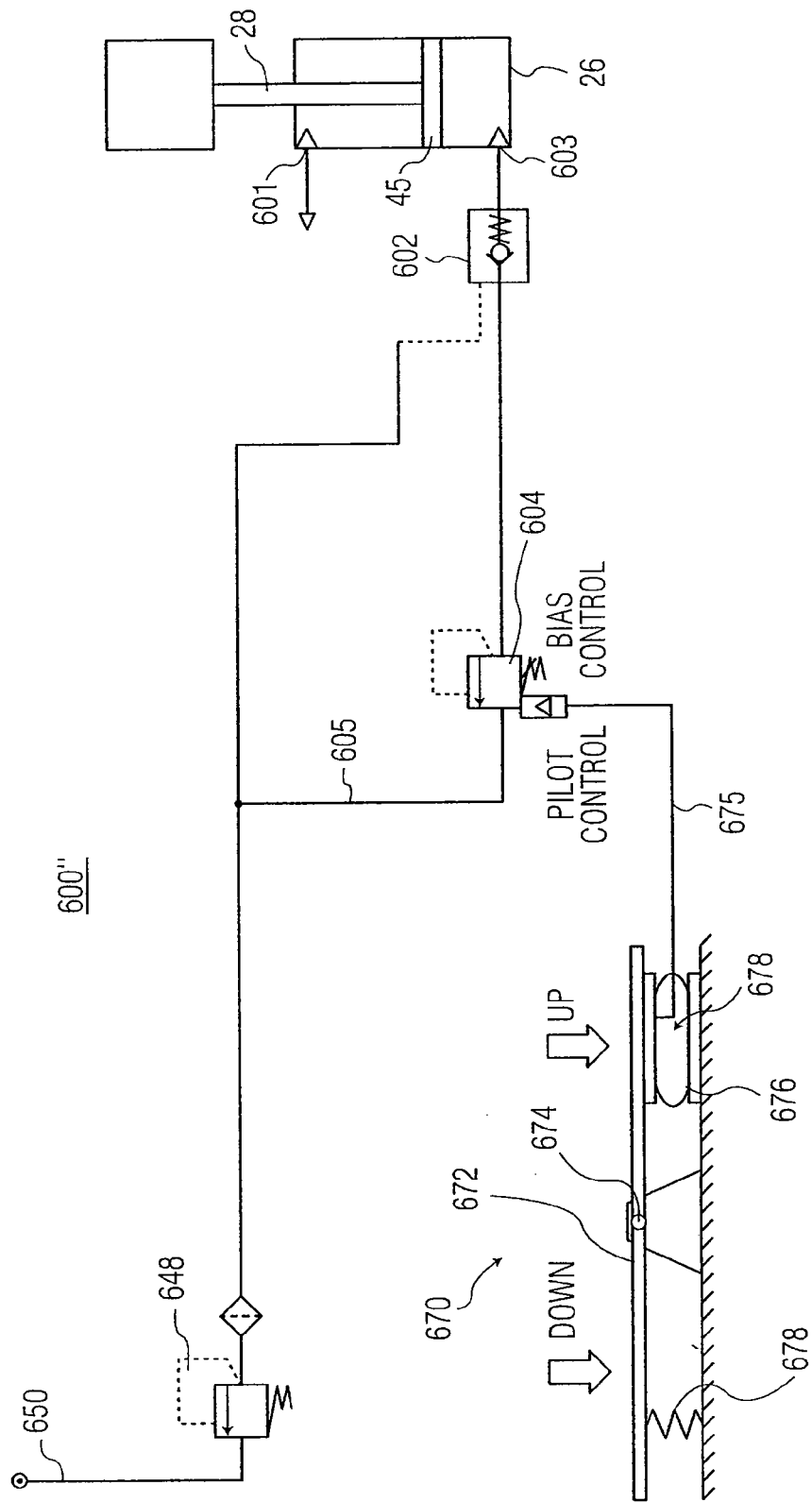
FIG. 8 is a schematic diagram of a portion of yet another exemplary pneumatic system for controlling movement of the automated testing apparatus.

Referring to FIG. 8, another illustrative exemplary pneumatic system 600" which is part of the pneumatic control unit 18 and which is configured to control the linear motion of the telescoping column 20 will be described. The pneumatic system 600" is substantially the same as in the previous embodiment, but replaces the throttle assembly 660 with a pedal throttle assembly 670, which is also continuously variable over its range of motion, provides the operator with tactile feedback, and places the operator within the motion control feedback loop.

The pedal throttle assembly 670 includes a variable volume chamber 678 defined by a flexible bladder 676. The bladder 676 includes an outlet connected to the pilot line 675. One end of a foot pedal 672 is pivotally supported above the bladder 676 by a pivot junction 674. The opposite end of the pedal 672 is desirably biased by a spring 678 or the like to return the pedal 672 to a neutral position upon release of the pedal 672. As in the previous embodiments, in the neutral position, a zero pressure is supplied to the pilot control of pressure regulator 604. It is desirable that the bladder 676 is slightly precompressed in the neutral position to provide equal up and down strokes. As indicated in FIG. 8, applying a force to pedal 672 which compresses the bladder 676 reduces the chamber 678 volume, thereby increasing the pilot pressure and causing upward movement of the telescoping column 20. Conversely, applying a force to pedal 672 which expands the bladder 676 increases the chamber 678 volume which decreases the pilot pressure and causes downward movement of the telescoping column 20.

Figure 9:
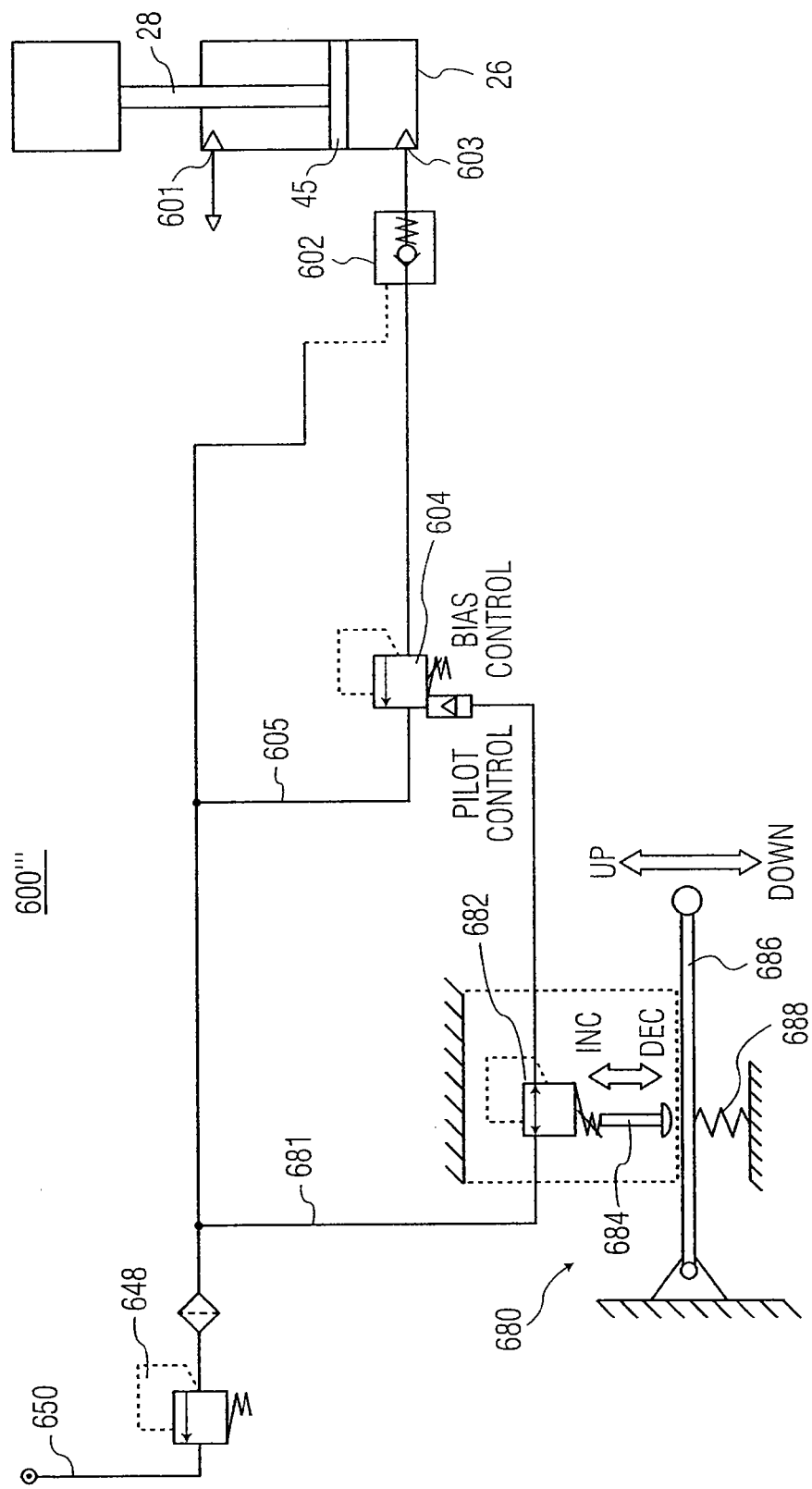
FIG. 9 is a schematic diagram of a portion of another exemplary pneumatic system for controlling movement of the automated testing apparatus.

Referring to FIG. 9, another illustrative exemplary pneumatic system 600''' which is part of the pneumatic control unit 18 and which is configured to control the linear motion of the telescoping column 20 will be described. The pneumatic system 600''' is substantially the same as in the previous two embodiments, but replaces the throttle assembly 660 with a plunger throttle assembly 680, which is also continuously variable over its range of motion.

The plunger throttle assembly 680 includes a plunger actuated pressure regulator 682 which receives input pressure from the pressure source 650 via line 681. The present plunger actuated pressure regulator 682 is continuously variable over a range from atmospheric pressure to a positive pressure via a plunger 684. The plunger throttle assembly 680 includes a handle 686 or the like configured to engage the plunger 684. A spring 688 or the like biases the handle 686 against the plunger 684 so that the plunger 684 is moved to a neutral position wherein a desired preload pressure flows through the regulator 682. In the present embodiment, the biased pressure regulator 604 yields an output pressure that is substantially equal to the set pressure which is the sum of the inputs, i.e. from the biasing member and the preload pressure. The biasing member is initially set taking into account the preload pressure. The preload pressure can be any desired pressure, for example, 10 psi, to provide a sufficient range of increase or decrease in the set pressure. Movement of the handle 686 toward the plunger 684 causes an increased pressure more than the preload pressure to flow through the plunger actuated pressure regulator 682 to the pilot control of the pressure regulator 604. Movement of the handle 686 away from the plunger 684 causes a decreased pressure less than the preload pressure to flow through the plunger actuated pressure regulator 682 to the pilot control of the pressure regulator 604. As in the previous two embodiments, the control of increased or decreased pressure is continuously variable over the range of motion of the handle 686 and provides the operator a means to control the vertical motion.

Figure 10:
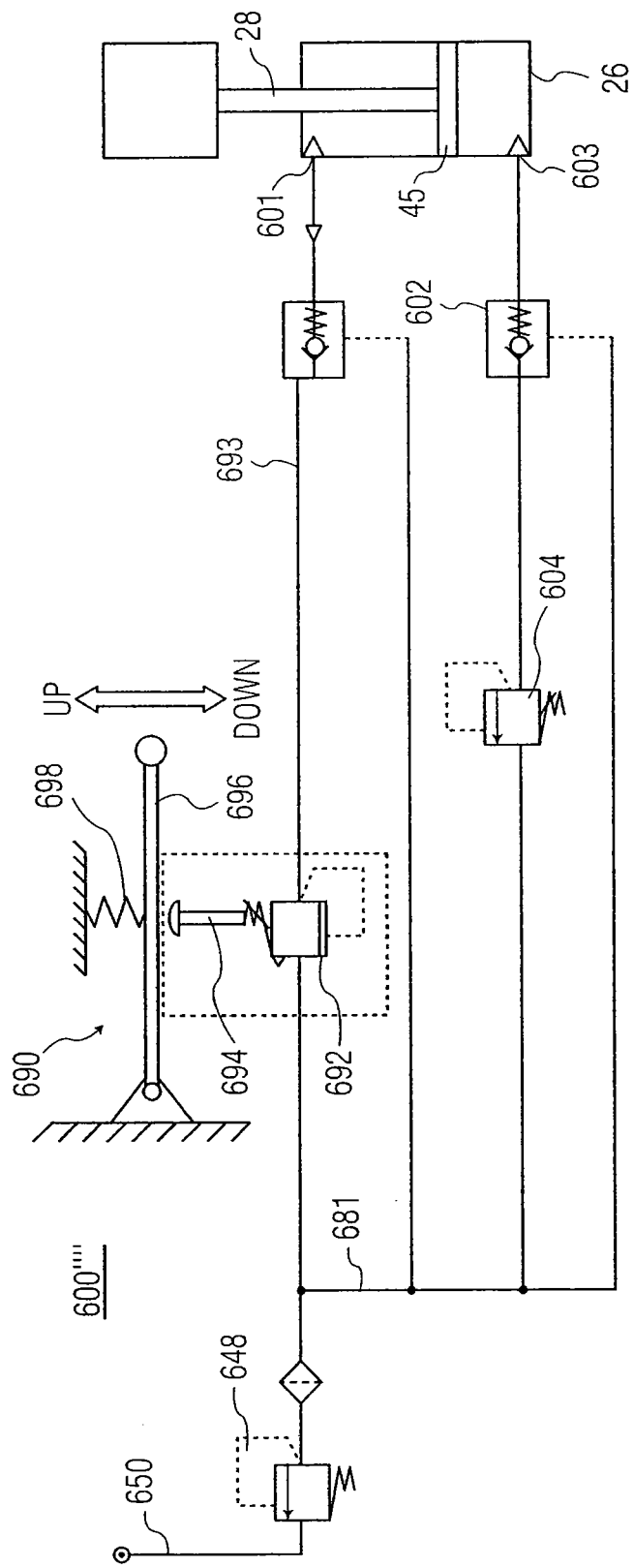
FIG. 10 is a schematic diagram of a portion of another exemplary pneumatic system for controlling movement of the automated testing apparatus.

Referring to FIG. 10, another illustrative exemplary pneumatic system 600"" which is part of the pneumatic control unit 18 and which is configured to control the linear motion of the telescoping column 20 will be described. The pneumatic system 600"" is substantially the same as in the previous embodiment, but locates the plunger throttle assembly 690 along a fluid path 693 connected with the port 601 of the pneumatic unit 26 on the opposite side of the piston 45 such that the fluid counteracts the pressure delivered to port 603 via the pressure regulator 604.

The plunger throttle assembly 690 includes a plunger actuated pressure regulator 692 which receives input pressure from the pressure source 650 via line 691. The present plunger actuated pressure regulator 692 is continuously variable over a range from atmospheric pressure to a positive pressure via a plunger 694. The plunger throttle assembly 690 includes a handle 696 or the like configured to engage the plunger 694. A spring 698 or the like biases the handle 696 against the plunger 694 so that the plunger 694 is moved to a neutral position wherein a desired counter pressure flows through the regulator 692. In the present embodiment, the pressure regulator 604 is configured to yield an output pressure that is greater than the pressure required to maintain the load in a balanced condition by an amount substantially equal to the neutral position counter pressure. Since the neutral position counter pressure is supplied to port 601, this counter pressure counteracts the pressure provided via regulator 604, with a resultant pressure substantially equal to the pressure required to maintain the load in a balanced condition. The neutral position counter pressure can be any desired pressure, for example, 10 psi, to provide a sufficient range of increase or decrease in the counter pressure. Increasing or decreasing the counter pressure from the neutral position counter pressure results in an unbalanced force upon the piston 45. Movement of the handle 696 toward the plunger 694 causes an increased counter pressure, thereby moving the piston 45 down. Movement of the handle 696 away from the plunger 694 decreases the counter pressure, thereby causing the piston 45 to move upward. As in the previous embodiments, the control of increased or decreased pressure is continuously variable over the range of motion of the handle 696 and provides the operator a means to control the vertical motion.

Figure 11:
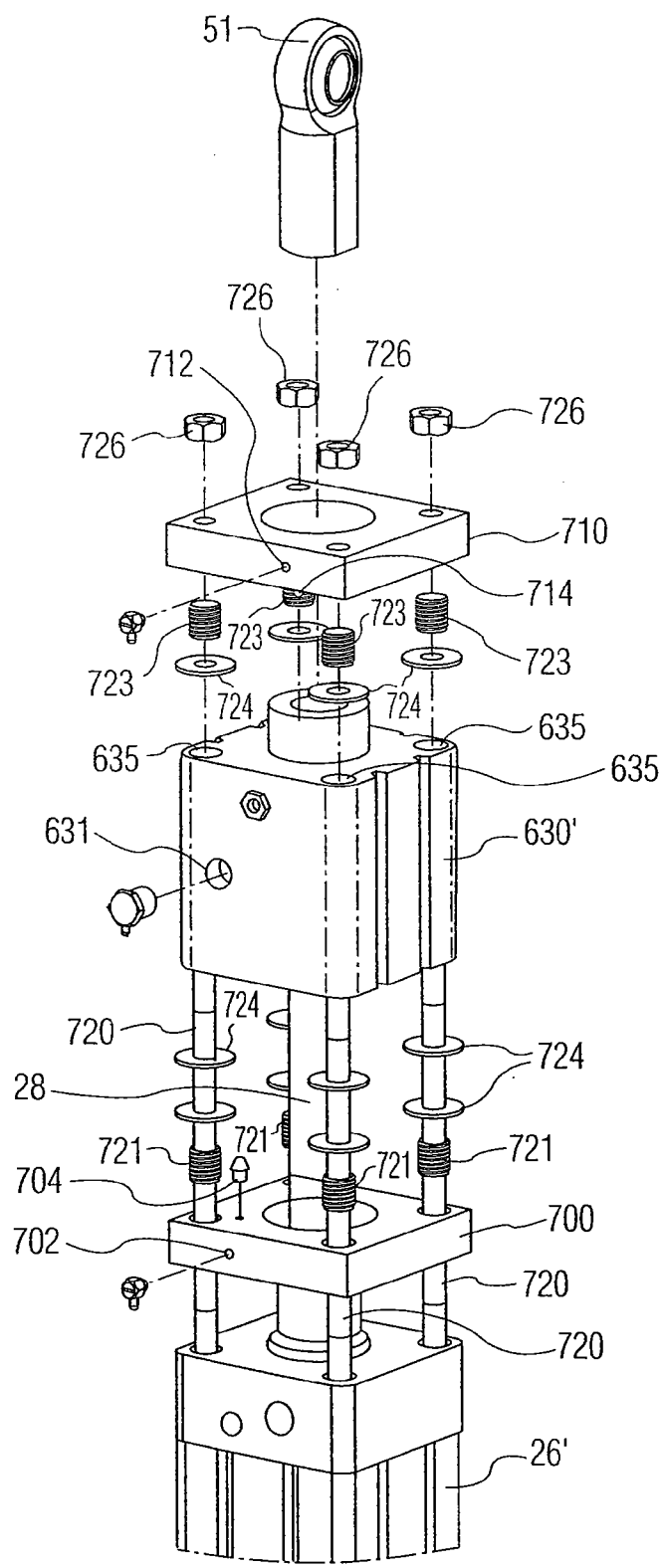
FIG. 11 is an exploded perspective view of a portion of another exemplary pneumatic unit.
Figure 12:
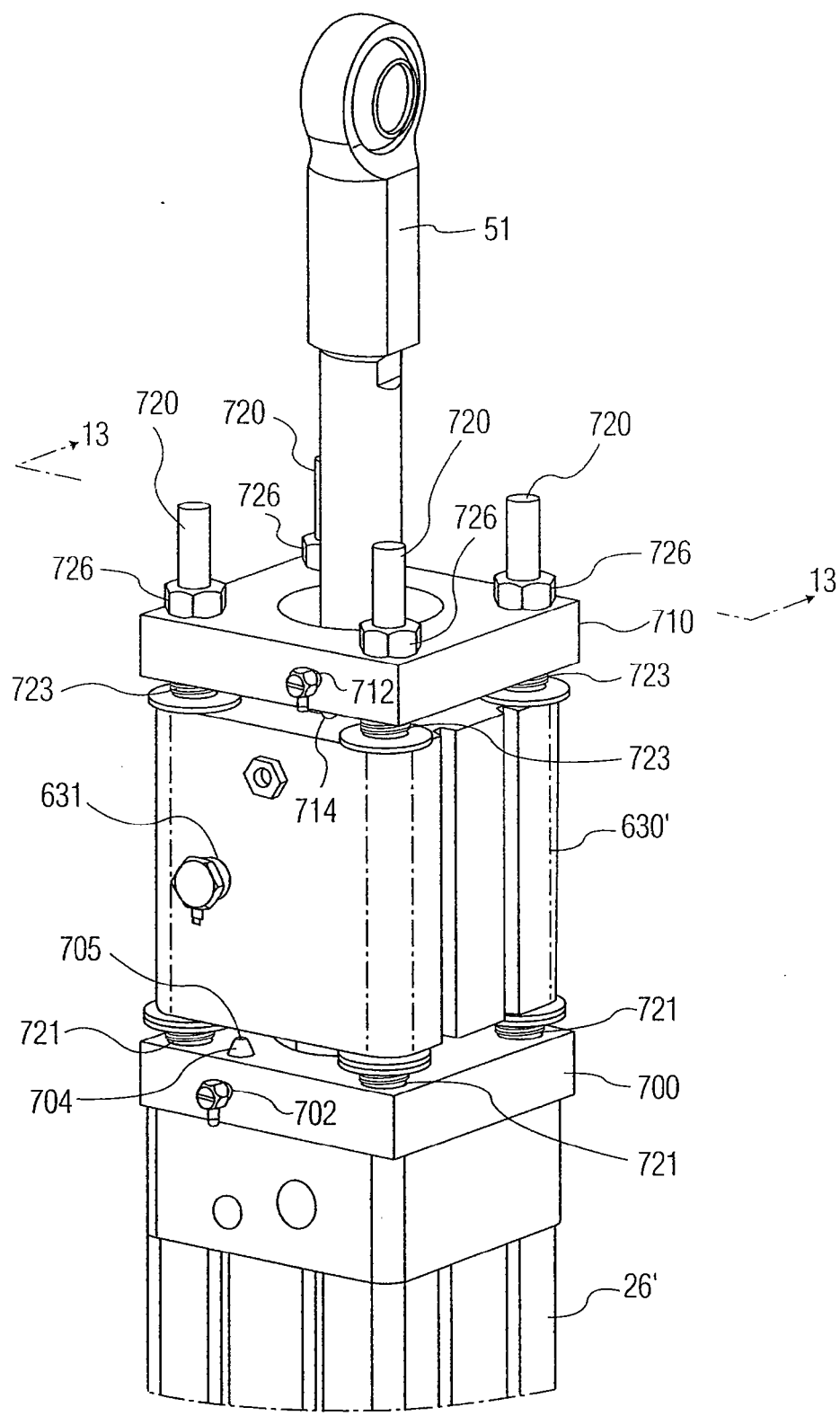
FIG. 12 is an assembled perspective view of the pneumatic unit of FIG. 11.
Figure 13:
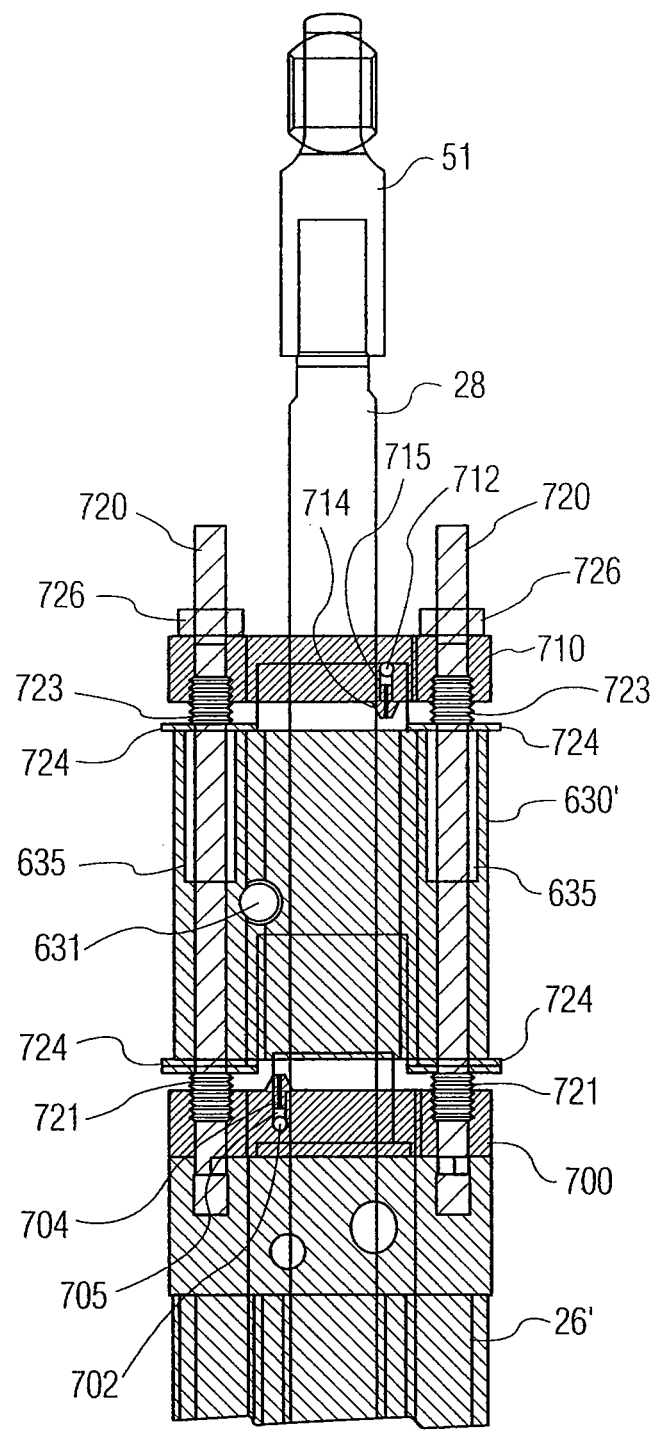
FIG. 13 is a cross-sectional view of the pneumatic unit taken along the lines 13-13 shown in FIG. 12.

Referring to FIGS. 11-13, a pneumatic unit 26' that is an alternative embodiment of the invention will be described. As in the previous embodiment, the pneumatic unit 26' includes a cylinder block, as described previously, a telescoping piston rod 28 that travels within the cylinder block, and a spherical bearing 51. In the illustrated embodiment, the pneumatic unit 26 includes a brake lock 630' configured to lock the position of the telescoping piston rod 28 relative to the cylinder block of the pneumatic unit 26'. The brake lock 630' is further configured to provide a pneumatic signal to the pneumatic control unit 18 if the pneumatic cylinder is out of balance by more than a given amount. The pneumatic control unit 18 may be configured to prevent unlocking of the brake lock 630' when such signal is received.

Referring to FIGS. 11-13, the brake lock 630' includes a brake control port 631. As in the previous embodiment, the brake lock 630' has a default locked position such that the lock is applied when no pressure is received through port 631. When the brake lock 630' is switched to an unlocked position, fluid will be provided to port 631 to release the brake lock 630' provided an unbalanced condition is not detected as described below.

In the present embodiment, the brake lock 630' includes through passages 635 which facilitate positioning of the brake lock 630' on corresponding support rods 720. The support rods 720 are each secured at a first end to the cylinder block of the pneumatic unit 26'. The brake lock 630' is axially moveable along the rods 720 between a bottom contact plate 700 and a top contact plate 710. Springs 721 or the like are positioned between the bottom plate 700 and the brake lock 630' and springs 723 or the like are positioned between the top plate 710 and the brake lock 630'. The springs 721 and 723 support the brake lock 630' for a limited range of motion between the plates 700 and 710. Nuts 726 or the like are secured to the opposite ends of the rods 720 to axially secure the plates 700, 710, springs 721, 723 and brake lock 630'. The amount of tightening of the nuts 726 may be utilized to control the range of motion of the brake lock 630' between the plates 700 and 710, thereby control the tolerance of the unbalanced signal.

As described with reference to FIG. 6 and also illustrated in FIG. 14, when the lock switch is moved to the locked position, pneumatic pressure is removed from the brake lock 630, 630' and the lock is applied to the piston rod 28, thereby fixing the lock relative to the piston rod 28. In the present embodiment, the springs 721, 723 allow the brake lock 630' to move over a limited range of motion. As such, for example, if the brake lock 630' is locked and thereafter additional weight or external force is applied on the piston rod 28, the piston rod 28, and the brake lock 630' fixed thereto, will move against the force of springs 721. If the weight or external force is sufficient, the brake lock 630' will move into contact with the bottom plate 700. As described hereinafter, the system is configured to provide a pneumatic signal indicating an unbalanced condition when the brake lock 630' moves into contact with the bottom plate 700. Similarly, if weight is removed from the piston rod 28, the piston rod 28, and the brake lock 630' fixed thereto, will move upward against the force of springs 723 due to the pressure in the pneumatic unit 26. If the decrease is sufficient, the brake lock 630' will move into contact with the top plate 710. Again, the system is configured to provide a pneumatic signal indicating an unbalanced condition when the brake lock 630' moves into contact with the top plate 710.

Figure 14:
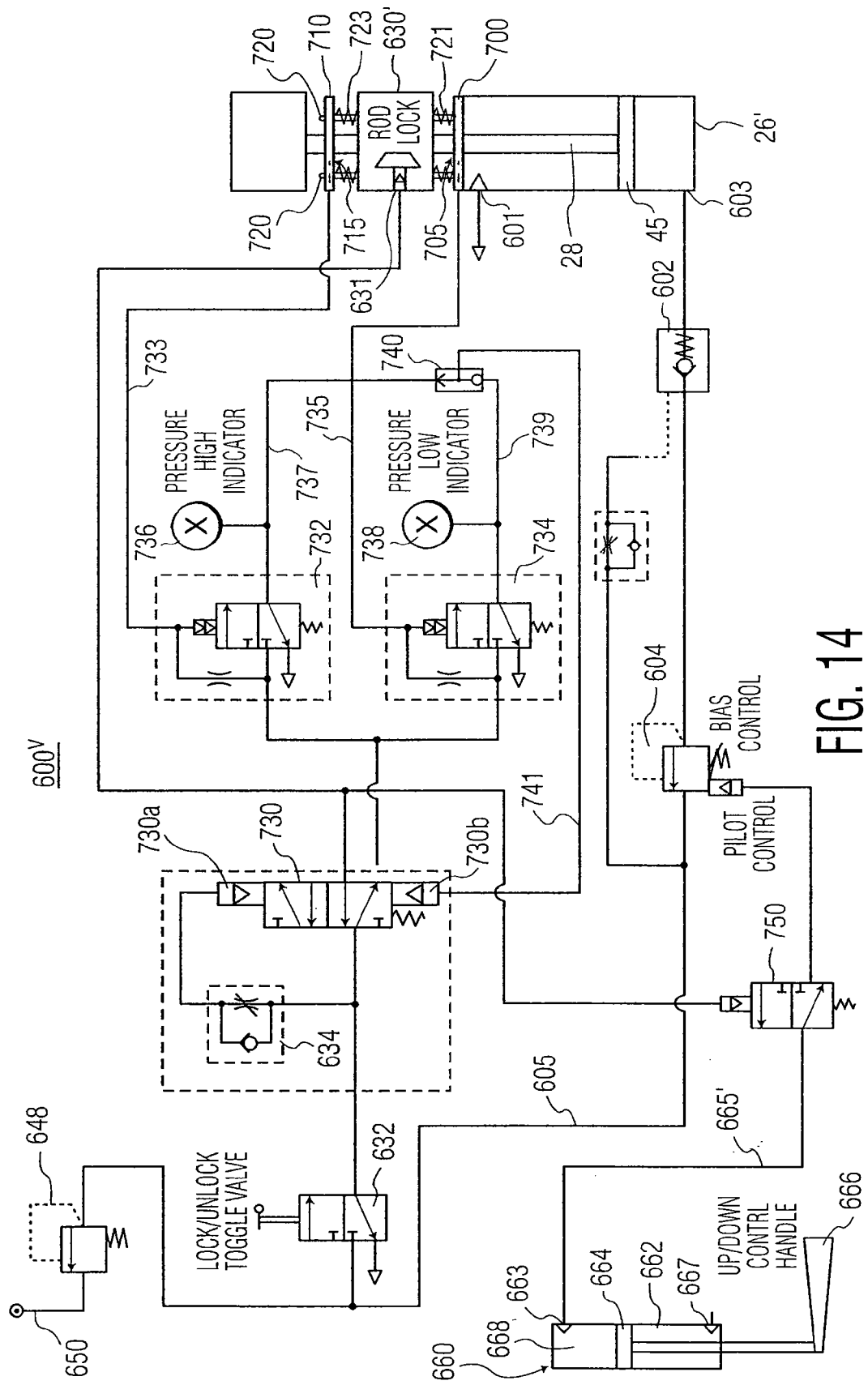
FIG. 14 is a schematic diagram of a portion of another exemplary pneumatic system for controlling movement of the automated testing apparatus.

A exemplary pneumatic system 600$^v$ configured to provide such a pneumatic signal of an unbalanced condition is illustrated schematically in FIG. 14. The system 600$^v$ includes a throttle assembly 660 similar to that described with reference to FIG. 7, but any up and down control system may be utilized. As in the previous embodiments, pressurized fluid is supplied from the fluid source 650 to the pressure regulator 604. In the present embodiment, pressurized fluid is also provided to lock/unlock toggle valve 632.

The toggle valve 632 is normally closed so that no pressure is applied to brake lock 630', locking the brake lock 630' to the piston rod 28. To release the brake lock 630', the toggle is switched to the open position. The fluid flowing through the opened toggle valve 632 flows to a detector valve 730. The detector valve 730 is spring biased to an initial position wherein fluid travels toward a pair of sensor valves 732 and 734, but not to the brake lock port 631. The fluid also travels through a restrictor 634 toward an opening pilot 730a on the detector valve 730. The restrictor 634 is configured to provide a sufficient delay before the opening pilot is energized to open the detector valve from its initial position.

Sensor valve 732 is connected via line 733 to an inlet port 712 on top plate 710 which is fluidly connected to an open port 715 through compressible plug 714 extending from the bottom surface of top plate 710, as shown in FIGS. 11-13. Similarly, sensor valve 734 is connected via line 735 to an inlet port 702 on bottom plate 700 which is fluidly connected to an open port 705 through compressible plug 704 extending from the top surface of bottom plate 710. Each of the sensor valves 732, 734 has a normally closed position such that the fluid flowing thereto bypasses the valve 732, 734 and flows out the respective open port 715, 705. Provided there is no back pressure, both sensor valves 732, 734 will remain in such closed condition.

If an unbalanced condition exists as described above, the brake lock 630' will contact one of the plates 700, 710 and compress the respective plug 704, 714, thereby closing the open port 705, 715. Due to the closed port, 705, 715, a back pressure will be received at the respective sensor valve 734, 732. The back pressure energizes the respective sensor pilot and causes the sensor valve 734, 732 to open. Fluid travels through the sensor 732, 734 and actuates a respective pressure high or pressure low indicator 736, 738. The flow continues through either line 737 or 739 and through a shuttle valve 740 to the maintain closed pilot 730b of detector valve 730. The force of the maintain closed pilot 730b in combination with the original spring bias of the valve 730 will maintain the valve 730 in its initial position even upon fluid passing through the restrictor 634 and reaching the opening pilot 730a. The detector valve 730 will remain in this initial position, and will not allow fluid to flow to the brake release port 631, until the load is balanced, thereby uncompressing the plug 704 or 714 and removing the back pressure on the actuated sensor valve 732, 734.

The pressure high and pressure low indicators 736, 738 may be utilized in rebalancing the load. As explained above, if the load is unbalanced when the toggle valve 632 is moved to the unlock position, the brake lock 630' will not release and either the pressure high indicator 736 or the pressure low indicator 738 will be actuated. Upon actuation, the indicators 736, 738 provide a signal to an operator that the load is unbalanced, i.e. if the load has been reduced, the pressure high indicator 736 will provide a signal and if load has been increased, the pressure low indicator 738 will provide a signal. The signals may take various forms, for example, an audible signal, a visual signal, or a combination thereof. In an exemplary configuration, each indicator 736, 738 includes an extensible post (not shown) which is pneumatically extending upon actuation of the indicator 736 or 738.

The indicator signals alert the operator to the necessary pressure adjustment to rebalance the load. If the pressure high indicator 736 is actuated and providing a signal, the operator is alerted to decrease the set pressure of the biased pressure regulator 604, for example, by reducing the force on the mechanical biasing member. If the pressure low indicator 738 is actuated and providing a signal, the operator is alerted to increase the set pressure of the biased pressure regulator 604, for example, by increasing the force on the mechanical biasing member. In an exemplary configuration, the means for increasing or decreasing the force on the mechanical biasing member is through a rotatable dial. In this configuration, the indicators 736, 738 may be positioned relative to the rotatable dial such that the actuated indicator 736 or 738 will guide the operator of the proper direction to rotate the dial to rebalance the load. For example, if counterclockwise rotation of the dial decreases the set pressure and clockwise rotation of the dial increases the set pressure, the pressure high indicator 736 is positioned to the left of the dial and the pressure high indicator 738 is positioned to the right of the dial. As such, if the pressure high indicator 736 is actuated, the operator will know to turn toward the indicator 736, thereby turning the dial in the counterclockwise direction, and conversely, if the pressure low indicator 738 is actuated, the operator will know to turn toward the indicator 738, thereby turning the dial in the clockwise direction. The invention is not limited to this configuration of the adjustment mechanism or indicators.

Once the load is rebalanced, or if the load was balanced to begin, both ports 715 and 705 will remain open and the corresponding sensor valves 732, 734 will remain closed. With the sensor valves 732, 734 closed, no fluid pressure flows to the maintain closed pilot 730b of the detector valve 730. As such, the fluid which flows through the restrictor 634 will reach the opening pilot 730a and provide a force sufficient to overcome the original spring bias of the detector valve 730, thereby causing the detector valve 730 to open to allow fluid to flow to the release port 631 of the brake lock 630'. In the present embodiment, fluid also flows to an opening pilot of a throttle release valve 750. The throttle release valve 750 is positioned along the pilot line 665' and has a default closed position such that the throttle can not be used for up or down movement until the detector valve 730 is opened and the brake lock 630' released.

The illustrated embodiments show various features which may be incorporated into the pneumatic control unit 18. The invention is not limited to the illustrated features. Furthermore, while the system is described as a pneumatic system utilizing pressurized air, other fluids may be utilized. Additionally, while the various control systems described herein are described with respect to specific testing apparatus, the systems are not limited to such and may be utilized with any testing apparatus or load positioning apparatus, for example, but not limited to, the apparatus described in U.S. Pat. No. 7,235,964 and co-pending U.S. application Ser. Nos. 10/567,201 and 60/903,015, each of which is incorporated herein by reference. Furthermore, such control systems are not limited to linear actuated systems, but can be utilized with any load positioning apparatus, for example, rotating prime movers.

While exemplary embodiments of the invention have been shown and described herein, it will be understood that such embodiments are provided by way of example only. Numerous variations, changes and substitutions will occur to those skilled in the art without departing from the spirit of the invention. Examples of such variations are included below.

The pneumatic positioner system is not limited to electronic device testing equipment, as other applications and industries are envisioned. The pneumatic positioner system may be utilized in X-Ray machines, or any other automated load bearing equipment. Accordingly, the term "load" recited in the appended claims is not limited to a test head, and may represent any object. Also, the positioner system is not limited to air powered pneumatics, as other power systems are envisioned such as hydraulics, motors, gears, internal combustion, etc.

Accordingly, it is intended that the appended claims cover all such variations as fall within the spirit and scope of the invention.

What is claimed:

1. A load positioning system for translating a load along an axis of translation, said load positioning system comprising:
a support for supporting said load;
a fluidly operated piston configured to drive said support along said axis of translation;
a regulator unit configured to control a pressure of a primary fluid delivered to said fluidly operated piston, said regulator unit receiving said primary fluid and a further fluid, wherein said regulator unit receives said primary fluid independently of said further fluid and said further fluid is excluded from said fluidly operated piston; and
a control unit configured to control a pressure of said further fluid to said regulator unit, wherein increasing the pressure of said further fluid causes said pressure of said primary fluid to be increased and said support to move in a first direction, decreasing the pressure of said further fluid causes said pressure of said primary fluid to be decreased and said support to move in the opposite direction, and maintaining the pressure of said further fluid at a constant pressure substantially maintains the position or speed of said support along said axis of translation.

2. The load positioning system of claim 1 wherein said support comprises a column.

3. The load positioning system of claim 1 wherein said support comprises a telescoping column.

4. The load positioning system of claim 1 wherein the pressure of said further fluid is continuously adjustable between a maximum pressure and a minimum pressure.

5. The load positioning system of claim 1 wherein a rate of movement of said support is continuously adjustable as a function of the pressure of said further fluid.

6. The load positioning system of claim 1 wherein said regulator unit is a biased pressure regulator.

7. The load positioning system of claim 1 wherein the control unit includes a toggle valve moveable between up, down and neutral positions which correspond to the pressure of said further fluid increasing, the pressure of said further fluid decreasing, and the pressure of the further fluid being maintained, respectively.

8. The load positioning system of claim 1 wherein the control unit includes a throttle assembly continuously adjustable between a maximum pressure increase position and a maximum pressure decrease position.

9. The load positioning system of claim 8 wherein the throttle assembly includes a throttle piston moveable within a throttle cylinder and having a first port vented to atmosphere and a second port in fluid communication with said regulator unit to provide said further fluid.

10. The load positioning system of claim 1 wherein the control unit includes a pedal throttle assembly continuously adjustable between a maximum pressure increase position and a maximum pressure decrease position.

11. The load positioning system of claim 10 wherein the pedal throttle assembly includes a flexible bladder with an outlet in fluid communication with said regulator unit to provide said further fluid.

12. The load positioning system of claim 1 wherein the control unit includes a plunger throttle assembly continuously adjustable between a maximum pressure increase position and a maximum pressure decrease position.

13. The load positioning system of claim 12 wherein the plunger throttle assembly includes a plunger actuated pressure regulator with an outlet in fluid communication with said regulator unit to provide said further fluid.

14. The load positioning system of claim 1 wherein the control unit includes a multi-position valve moveable between n number of positions which correspond to n number of pressure increase, pressure decrease or pressure maintain positions or a combination thereof.

15. The load positioning system of claim 1, wherein increasing said pressure of said further fluid causes an operating force at said fluidly operated piston to be modified and said support to move in said first direction, and decreasing said pressure of said further fluid causes said operating force to be oppositely modified and said support to move in said opposite direction.

16. A load positioning system for translating a load along an axis of translation, said load positioning system comprising:

a support for supporting said load;
a fluidly operated piston configured to drive said support along said axis of translation;
a regulator unit configured to control a pressure of a primary fluid delivered to said fluidly operated piston, said regulator unit receiving said primary fluid and a further fluid; and a control unit configured to control a pressure of said further fluid to said regulator unit, said control unit configured for selecting said pressure of said further fluid to said regulator unit to be at any of a plurality of different pressures while said piston is driving said support along said axis of translation, wherein increasing the pressure of said further fluid causes said pressure of said primary fluid to be increased and said support to move in a first direction, further increasing the pressure of said further fluid causes said support to move faster in said first direction, decreasing the pressure of said further fluid causes said pressure of said primary fluid to be decreased and said support to move in the opposite direction, and maintaining the pressure of said further fluid at a constant pressure substantially maintains the position or speed of said support along said axis of translation, and wherein said further fluid is excluded from said fluidly operated piston.

17. The load positioning system of claim 16 wherein said support comprises a column.

18. The load positioning system of claim 16 wherein said support comprises a telescoping column.

19. The load positioning system of claim 16 wherein increasing said pressure of said further fluid causes said operating force to increase and decreasing said pressure of said further fluid causes said operating force to decrease.

20. The load positioning system of claim 16 wherein increasing said pressure of said further fluid causes said operating force to decrease and decreasing said pressure of said further fluid causes said operating force to increase.

21. The load positioning system of claim 16 wherein said regulator unit is a biased pressure regulator.

22. The load positioning system of claim 16 wherein the control unit includes a toggle valve moveable between up, down and neutral positions which correspond to an increase in pressure of said further fluid, a decrease in pressure of said further fluid, and a maintaining in pressure of said further fluid, respectively.

23. The load positioning system of claim 16 wherein the control unit includes a throttle assembly continuously adjustable between a maximum pressure increase position and a maximum pressure decrease position.

24. The load positioning system of claim 23 wherein the throttle assembly includes a throttle piston moveable within a throttle cylinder and having a first port vented to atmosphere and a second port in fluid communication with said regulator unit to provide said further fluid.

25. The load positioning system of claim 16 wherein the control unit includes a pedal throttle assembly continuously adjustable between a maximum pressure increase position and a maximum pressure decrease position.

26. The load positioning system of claim 25 wherein the pedal throttle assembly includes a flexible bladder with an outlet in fluid communication with said regulator unit to provide said further fluid.

27. The load positioning system of claim 16 wherein the control unit includes a plunger throttle assembly continuously adjustable between a maximum pressure increase position and a maximum pressure decrease position.

28. The load positioning system of claim 27 wherein the plunger throttle assembly includes a plunger actuated pressure regulator with an outlet in fluid communication with said regulator unit to provide said further fluid.

29. The load positioning system of claim 27 wherein the plunger throttle assembly includes a plunger actuated pressure regulator with an outlet in fluid communication with an outlet port of said fluidly operated piston to provide said further fluid to an opposite side of an internal piston relative to the primary fluid.

30. A load positioning system according to claim 16, wherein said regulator unit receives said primary fluid independently of said further fluid.

\* \* \* \* \*